(12) United States Patent
Ikeda et al.

(10) Patent No.: US 7,365,611 B2
(45) Date of Patent: Apr. 29, 2008

(54) ELEMENT SUBSTRATE, TEST METHOD FOR ELEMENT SUBSTRATE, AND MANUFACTURING METHOD FOR SEMICONDUCTOR DEVICE

(75) Inventors: Takayuki Ikeda, Kanagawa (JP); Atsuo Isobe, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 132 days.

(21) Appl. No.: 11/421,634

(22) Filed: Jun. 1, 2006

(65) Prior Publication Data
US 2007/0011520 A1    Jan. 11, 2007

(30) Foreign Application Priority Data
Jun. 1, 2005  (JP) .............................. 2005-160947

(51) Int. Cl.
G01R 23/00  (2006.01)
G01R 31/26  (2006.01)
H01L 21/66  (2006.01)

(52) U.S. Cl. .......................................... 331/44; 438/18
(58) Field of Classification Search ................... 331/44, 331/57; 438/5, 10, 11, 14, 17, 18, 478, 479, 438/510
See application file for complete search history.

(56) References Cited

U.S. PATENT DOCUMENTS

| | | | |
|---|---|---|---|
| 6,887,724 B2 | 5/2005 | Nakamura et al. | |
| 7,291,507 B2 * | 11/2007 | Bidermann et al. | ........... 438/14 |
| 2004/0101989 A1 | 5/2004 | Honda | |
| 2005/0017239 A1 | 1/2005 | Nakamura et al. | |
| 2005/0024079 A1 | 2/2005 | Honda et al. | |
| 2005/0196883 A1 | 9/2005 | Asano et al. | |
| 2005/0273290 A1 | 12/2005 | Asano et al. | |

* cited by examiner

*Primary Examiner*—David Mis
(74) *Attorney, Agent, or Firm*—Fish & Richardson P.C.

(57) ABSTRACT

A test circuit and a test method using a plurality of oscillation circuits for evaluation are provided in order to reduce the measuring time and simplify the test. One measuring terminal is shared by a plurality of oscillation circuits for evaluation that are formed over the same substrate as a semiconductor device such as a display device, and the plurality of oscillation circuits for evaluation can be tested by the measuring output terminal. Then, the measurement results are Fourier transformed to obtain the oscillation frequency of the plurality of oscillation circuits for evaluation at the same time. Thus, variations in semiconductor elements can be evaluated.

24 Claims, 15 Drawing Sheets

PRIOR ART

ELEMENT SUBSTRATE, TEST METHOD FOR ELEMENT SUBSTRATE, AND MANUFACTURING METHOD FOR SEMICONDUCTOR DEVICE

BACKGROUND OF THE INVENTION

1. Field of the Invention

The present invention relates to a test method using a plurality of oscillation circuits. The invention also relates to an element substrate for carrying out the test method, and a manufacturing method for a semiconductor device using the test method.

2. Description of the Related Art

In a manufacturing process of a semiconductor device such as a display device, which includes a plurality of steps such as etching and doping, an oscillation circuit as an evaluation circuit (hereinafter referred to as an oscillation circuit for evaluation) is provided over the same substrate as the semiconductor device such as a display device in order to evaluate electrical characteristics of a manufactured semiconductor element.

In conventional technologies, the oscillation frequency of a plurality of oscillation circuits for evaluation is measured by applying a needle called a probe to each of the oscillation circuits for evaluation. Such a measurement method using a probe is called a contact measurement method.

As a semiconductor device capable of using such a contact evaluation method, there are display devices such as a liquid crystal display device and an EL (Electro Luminescence) display device, as well as logic circuit devices such as a CPU (Central Processing Unit), an ASIC (Application Specific Integrated Circuit), and a memory, and an RFID (Radio Frequency Identification) circuit device for communicating information wirelessly.

The oscillation circuit for evaluation includes a ring oscillator and a PLL (Phase Lock Loop). In addition, the oscillation circuit for evaluation generally includes a VCO (Voltage Control Oscillator) that is a component of the PLL, and an LC oscillation circuit having a coil and a capacitor.

In particular, the ring oscillator is generally often used for measurement of the electrical characteristics of a manufactured semiconductor element and evaluation of variations in electrical characteristics.

In the conventional measurement of oscillation circuits for evaluation, a probe is applied to a measuring terminal of each of the oscillation circuits for evaluation; therefore, it takes time to measure including movement of the probe.

In addition, a plurality of oscillation circuits for evaluation cannot be simultaneously measured in the conventional measurement of oscillation circuits. Accordingly, there is fear that a measurement environment such as parasitic capacitance, power supply, and temperature may change.

Since a plurality of oscillation circuits for measurement are not measured at the same time in the conventional measurement of oscillation circuits, measurement errors may differ for each measurement. The measurement errors are caused by errors of a measuring instrument or errors in reading.

SUMMARY OF THE INVENTION

In view of the foregoing problems, the invention is made to provide a combined oscillation circuit for evaluation for measuring a plurality of oscillation circuits for evaluation at the same time, a method for measuring the combined oscillation circuit for evaluation for measuring a plurality of oscillation circuits for evaluation at the same time, and an element substrate capable of performing the measurement.

In order to solve the foregoing problems, according to the invention, a measuring terminal is shared by a plurality of oscillation circuits for evaluation. In order to be shared, the measuring terminal is electrically connected through a wire or the like.

According to the invention, terminals such as a power supply terminal, a ground terminal, and a control input terminal as well as a measuring terminal may be shared by a plurality of oscillation circuits for measurement.

A measuring terminal may be shared by a plurality of oscillation circuits for evaluation by connecting the plurality of oscillation circuits for evaluation to the measuring terminal through en element such as a resistor and a capacitor.

Alternatively, a measuring terminal may be shared by a plurality of oscillation circuits for evaluation by directly connecting the plurality of the oscillation circuits for evaluation to the measuring terminal.

Structures of the invention are specifically described.

One mode of the invention is an element substrate having a semiconductor device including a transistor, a measuring terminal, a plurality of oscillation circuits for evaluation, and a wire used for sharing the measuring terminal among the plurality of oscillation circuits for evaluation (a wire connecting the plurality of oscillation circuits for evaluation to the measuring terminal). Each of the plurality of oscillation circuits for evaluation has a transistor. The transistor included in each of the oscillation circuits for evaluation is manufactured in the same step as the transistor included in the semiconductor device to be evaluated.

Another mode of the invention is an element substrate having a semiconductor device including a transistor, a measuring terminal, a plurality of oscillation circuits for evaluation, and a wire used for sharing the measuring terminal among the plurality of oscillation circuits for evaluation. The measuring terminal has a power supply terminal, a ground terminal, or a control input terminal. Each of the oscillation circuits for evaluation has a transistor. The transistor included in each of the oscillation circuits for evaluation is manufactured in the same step as the transistor included in the semiconductor device to be evaluated.

Another mode of the invention is an element substrate having a semiconductor device including a transistor, a measuring terminal, a plurality of oscillation circuits for evaluation in a first region and a plurality of oscillation circuits for evaluation in a second region, and a wire used for sharing the measuring terminal among the plurality of oscillation circuits for evaluation in the first region and the second region. Each of the plurality of oscillation circuits for evaluation has a transistor. The transistor included in each of the oscillation circuits for evaluation is manufactured in the same step as the transistor included in the semiconductor device to be evaluated.

Another mode of the invention is an element substrate having a semiconductor device including a transistor, a measuring terminal, a plurality of oscillation circuits for evaluation in a first region and a second region, and a wire used for sharing the measuring terminal among the plurality of oscillation circuits for evaluation in the first region and the plurality of oscillation circuits for evaluation in the second region. The measuring terminal has a power supply terminal, a ground terminal, or a control input terminal. Each of the plurality of oscillation circuits for evaluation has a transistor. The transistor included in each of the oscillation circuits for evaluation is manufactured in the same step as the transistor included in the semiconductor device to be evaluated.

Note that in the invention, the transistor included in the semiconductor device is provided in a pixel portion or a driver circuit portion.

According to the invention, such an element substrate can be tested efficiently.

One mode of the invention is a test method where transistors are formed in a pixel portion and an oscillation circuit portion for evaluation over a substrate in the same step, a plurality of oscillation circuits for evaluation having the transistors and a measuring terminal for connecting the plurality of oscillation circuits for evaluation are formed in the oscillation circuit portion for evaluation, and the transistor formed in the pixel portion is tested using the measuring terminal.

Another mode of the invention is a test method where transistors are formed in a pixel portion, a driver circuit portion, and an oscillation circuit portion for evaluation over a substrate in the same step, a plurality of oscillation circuits for evaluation having the transistors and a measuring terminal for connecting the plurality of oscillation circuits for evaluation are formed in the oscillation circuit portion for evaluation, and the transistors formed in the pixel portion and the driver circuit portion are tested using the measuring terminal.

Another mode of the invention is a test method where transistors are formed in a pixel portion, a driver circuit portion, and an oscillation circuit portion for evaluation over a substrate in the same step, a plurality of oscillation circuits for evaluation having the transistors and a measuring terminal for connecting the plurality of oscillation circuits for evaluation formed in the pixel portion and the driver circuit portion are formed in the oscillation circuit portion for evaluation, and the transistors formed in the pixel portion and the driver circuit portion are tested using the measuring terminal.

According to the invention, a semiconductor device can be manufactured using such a test method.

One mode of the invention is a manufacturing method for a semiconductor device, where a semiconductor film is formed in a pixel portion, a driver circuit portion, and an oscillation circuit portion for evaluation over a substrate, a gate electrode is formed over the semiconductor film with an insulating film interposed therebetween, an impurity element is added to the semiconductor film using the gate electrode to form an impurity region, a wire connected to the impurity region is formed, and a measuring terminal shared by oscillation circuits for evaluation is formed in the oscillation circuit portion for evaluation at the same time as the formation of the wire.

Another mode of the invention is a manufacturing method of a semiconductor device, where a semiconductor film is formed in a pixel portion, a driver circuit portion, and an oscillation circuit portion for evaluation over a substrate, a gate electrode is formed over the semiconductor film with an insulating film interposed therebetween, an impurity element is added to the semiconductor film using the gate electrode to form an impurity region, a wire connected to the impurity region is formed, and a measuring terminal shared by oscillation circuits for evaluation is formed in the oscillation circuit portion for evaluation at the same time as the formation of the wire, thereby testing the oscillation circuits for evaluation using the measuring terminal.

Another mode of the invention is a manufacturing method of a semiconductor device, where a semiconductor film is formed in a pixel portion, a driver circuit portion, and an oscillation circuit portion for evaluation over a substrate, a gate electrode is formed over the semiconductor film with an insulating film interposed therebetween, an impurity element is added to the semiconductor film using the gate electrode to form an impurity region, a wire connected to the impurity region is formed, and a measuring terminal shared by oscillation circuits for evaluation is formed in the oscillation circuit portion for evaluation at the same time as the formation of the wire, thereby testing the oscillation circuits for evaluation using the measuring terminal and cutting the oscillation circuit portion for evaluation.

In the invention, when measurement is performed by applying a probe to a measuring terminal shared by a plurality of oscillation circuits for evaluation, a waveform representing a time-varying potential or current of overlapping outputs of the plurality of oscillation circuits for evaluation is obtained. The overlapping potential is equal to a potential obtained by averaging the output potential of each of the oscillation circuits for evaluation if the plurality of oscillation circuits for evaluation share the measuring terminal and a sink current and a source current of an element for outputting the output potential of each of the oscillation circuits for evaluation are equal to each other. Note that the sink current is also called a low level output current, and refers to a current capable of flowing to an output. Meanwhile, the source current is also called a high level output current, and refers to a current capable of flowing from an output.

In the invention, when a waveform that is measured by applying a probe to a measuring terminal shared by a plurality of oscillation circuits for evaluation is Fourier transformed, a pattern having at least one maximum value (peak) can be obtained. A plurality of maximum values correspond to the frequency of each of the oscillation circuits for evaluation. That is to say, if each of the oscillation circuits for evaluation has a different frequency, a pattern with a plurality of maximum values can be obtained by Fourier transform.

In the invention, a substrate may be a single crystal silicon substrate including SOI (Silicon On Insulator), an insulating substrate made of quartz, glass, plastic, or the like, or a metal substrate.

In the invention, a plurality of oscillation circuits for evaluation shares a terminal; therefore, the oscillation frequency thereof can be measured by applying a probe to a smaller number of measuring terminals than the number of the oscillation circuits for evaluation.

In the invention, a plurality of oscillation circuits for evaluation shares a terminal; therefore, the oscillation frequency thereof can be simultaneously measured.

In the invention, a circuit for synchronizing a plurality of oscillation circuits for evaluation is formed to make it easy to simultaneously measure the oscillation frequency of the plurality of oscillation circuits for evaluation.

The synchronizing circuit can be constituted by a NAND, a NOR, a clocked inverter, an analog switch, or the like.

In the invention, at least one oscillation circuit for evaluation is formed over the same substrate as a semiconductor device such as a display device.

According to a plurality of oscillation circuits for evaluation of the invention that share a measuring terminal to be combined, the plurality of oscillation circuits for evaluation can be measured simultaneously, and measuring time including movement of a probe and the like can be reduced.

Further, according to a plurality of oscillation circuits for evaluation of the invention that share a measuring terminal to be combined, the plurality of oscillation circuits for evaluation can be measured simultaneously and thus measured in the same measurement environment. In addition, according to a plurality of oscillation circuits for evaluation of the invention that share a measuring terminal to be combined, the plurality of oscillation circuits for evaluation can be measured simultaneously, which results in reduced measurement errors.

According to the invention, if there are variations in characteristics of a semiconductor element, processing of a pattern such as a wire and a via, and processing and characteristics of an insulating film can be determined more easily than by a conventional evaluation method when a plurality of oscillation circuits for evaluation are designed to have the same oscillation frequency.

According to the invention, if characteristics of a semiconductor element, processing of a pattern such as a wire and a via, and processing and characteristics of an insulating film are stable for long time can be determined more easily than by a conventional evaluation method when a plurality of oscillation circuits for evaluation are designed to have the same oscillation frequency.

DETAILED DESCRIPTION OF THE INVENTION

Figure 1:
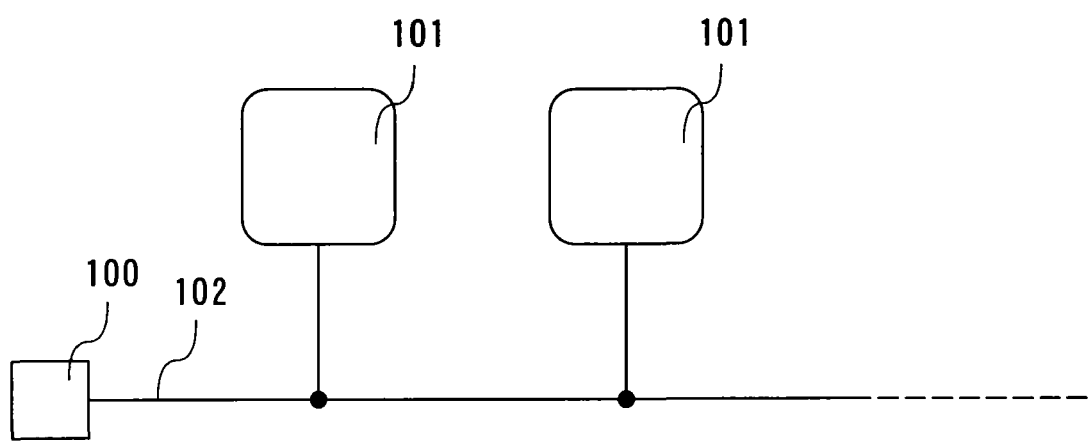
FIG. 1 is a diagram showing a structure of the invention.

Although the invention will be described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings for illustrating the embodiment modes and the embodiments, the identical portions or portions having similar function are denoted by the same reference numerals, and description thereon is not repeated.

Embodiment Mode 1

In this embodiment mode, a test method of the invention is described.

In FIG. 1, each of oscillation circuits for evaluation 101 has an output signal line that is connected to a measuring terminal 100 through a wire 102. In the invention, two or more oscillation circuits for evaluation 101 are provided. In FIG. 1, the oscillation circuits for evaluation 101 oscillate independently of each other, and output a potential that changes periodically. Each of the oscillation circuits for evaluation 101 may have a synchronizing circuit. If the synchronizing circuit is not provided, oscillation frequency cannot be obtained in rare cases. In view of such cases, the synchronizing circuit is desirably provided.

In the invention, a change in potential or current is measured by applying a measuring needle called a probe to the measuring terminal 100. Since the measuring terminal 100 is shared by the circuits in the invention, measuring time can be reduced. In addition, it is not necessary to apply a plurality of measuring needles simultaneously; therefore, problems in cost for producing the measuring needles and alignment of the measuring needles do not occur.

Figure 9:
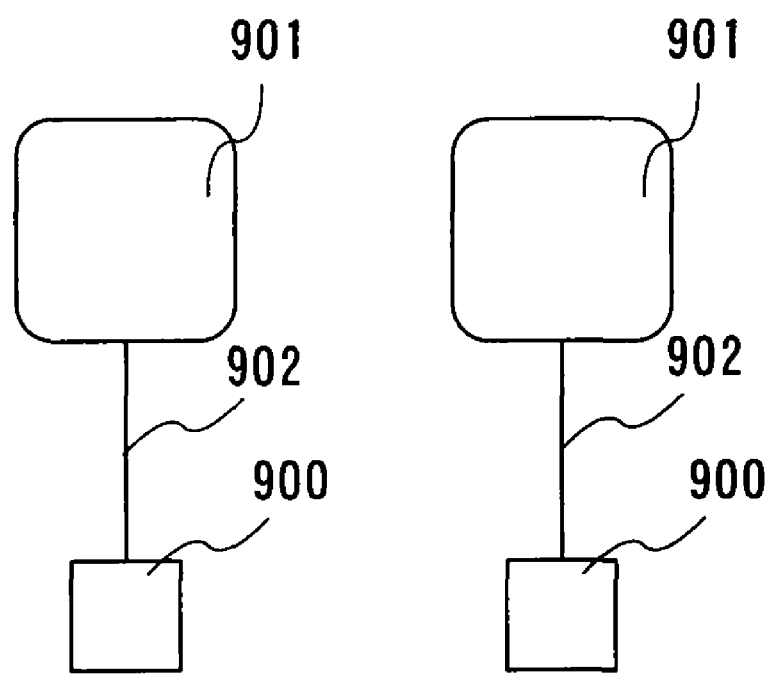
FIG. 9 is a diagram showing a structure of a conventional oscillation circuit for evaluation.

For comparison, FIG. 9 shows a structure of a conventional oscillation circuit for evaluation. In conventional technologies, an output signal of each of oscillation circuits for evaluation 901 is connected to respective measuring terminals 900 that are not electrically connected to each other, so that the plurality of oscillation circuits for evaluation 901 are measured by the respective measuring terminals 900.

In the structure of FIG. 9, it takes time to measure the output signal of each of the oscillation circuits for evaluation 901 by the respective measuring terminals 900. In addition, it is necessary to apply a plurality of measuring needles simultaneously; therefore, problems in cost for producing the measuring needles and alignment of the measuring needles occur.

According to the invention, the two or more measuring terminals 900 that operate independently of each other are combined into one. In the invention, the two or more measuring terminals 900 that operate independently of each other are combined into one by electrically connecting wires 902. As a result, the plurality of oscillation circuits for evaluation can be evaluated in one measurement, which allows the evaluation to be carried out more easily than in FIG. 9.

The measurement of the oscillation circuits for evaluation is performed the same number of times as the number of the measuring terminals both in conventional technologies and in the invention. In fact, the same circuit for evaluation may be measured repeatedly over time, and the number of times the measurement is performed is equal to the number of the measuring terminals multiplied by the number of repetitions. If the number of oscillation circuits for evaluation is the same in conventional technologies and in the invention, the number of measuring terminals in the invention is smaller than that in conventional technologies since measuring terminals are shared by the oscillation circuits for evaluation, which results in reduction in measuring time. For example, if one measuring terminal is shared by two oscillation circuits for evaluation in the invention, two oscillation circuits for evaluation may be measured only once while they are required to be measured twice in conventional technologies.

Further, if the number of measuring terminals is the same in conventional technologies and in the invention, the number of oscillation circuits for evaluation is larger than that in conventional technologies since oscillation circuits share the measuring terminals, which allows more oscillation circuits for evaluation to be evaluated. For example, if one measuring terminal is shared by two oscillation circuits for evaluation in the invention, two oscillation circuits for evaluation can be evaluated in one measurement while only one oscillation circuit for evaluation can be evaluated in conventional technologies.

In FIG. 1, when a change in potential of the measuring terminal 100 is measured to obtain the oscillation frequency, a waveform representing overlapping outputs of the plurality of oscillation circuits for evaluation 101 can be obtained. The oscillation frequency of the plurality of oscillation circuits for evaluation 101 can be obtained by observing the obtained waveform; however, it is not easy to obtain the oscillation frequency of the plurality of oscillation circuits for evaluation 101 if a complex waveform is obtained. Thus, according to the invention, the waveform obtained by the measurement is Fourier transformed so as to obtain the oscillation frequency of the plurality of oscillation circuits for evaluation 101. One of the features of the invention is a step of Fourier transforming. The oscillation frequency of the oscillation circuits for evaluation is obtained by Fourier transform. Different oscillation frequencies show that there are variations in electrical characteristics of semiconductor elements constituting the oscillation circuits for evaluation and there are variations in electrical characteristics of wires and vias due to processing. From the variations in electrical characteristics of the semiconductor elements and the like of the oscillation circuits for evaluation, it is suggested that there are variations in semiconductor elements constituting a semiconductor device such as a display device that is formed over the same substrate as the oscillation circuits for evaluation.

In general, when one oscillation circuit for evaluation outputs a non-sinusoidal waveform, a pattern with a plurality of maximum values is obtained by Fourier transforming the waveform outputted from one oscillation circuit for evaluation. Meanwhile, when one oscillation circuit for evaluation oscillates stably, a pattern obtained by Fourier transform has one maximum value in a frequency part with periodism of an output waveform.

Note that in a conventional test method, since a waveform of one oscillation circuit for evaluation is measured, the waveform is not required to be Fourier transformed to analyze the oscillation frequency. In the invention, the oscillation frequency can also be evaluated without Fourier transform if the oscillation frequency of a plurality of oscillation circuits for evaluation has the same phase. However, in the invention, Fourier transform is desirably carried out in order to accurately obtain variations in oscillation frequency.

In the invention, for example when a plurality of oscillation circuits for evaluation have the same electrical characteristics and the oscillation frequency thereof has the same phase, the same waveform as that of an output of one oscillation circuit for evaluation can be obtained. If the oscillation frequency has different phases, a waveform different from that of an output of one oscillation circuit for evaluation is obtained; however, a pattern obtained by Fourier transform has one maximum value in a frequency part with periodism of an output waveform of one oscillation circuit for evaluation. Accordingly, each of the oscillation circuits for evaluation can be tested.

In a conventional measurement of a plurality of oscillation circuits for evaluation, an output of each of the oscillation circuits for evaluation has the same waveform, for example when the plurality of oscillation circuits for evaluation have the same electrical characteristics. However, a change in measurement environment or a difference in measurement errors may occur since the oscillation circuits for evaluation are not measured at the same time.

In the invention, even when a plurality of oscillation circuits for evaluation are designed to have the same electrical characteristics, if there are variations in alignment on a substrate caused in manufacturing steps, a pattern obtained by Fourier transforming an output waveform of a combined oscillation circuit for evaluation has a plurality of maximum values in a frequency part with periodism of an output waveform. Alternatively, a pattern may have a plurality of maximum values that overlap each other and extend in the direction of the frequency axis.

In conventional technologies, in order to determine that there are no variations in characteristics of semiconductor elements and processing of a pattern depending on the position on a substrate, the measuring terminals 900 are required to be measured one by one to determine that they have the same oscillation frequency. According to the invention, however, when the measuring terminal 100 is measured and Fourier transformed, it is easy to determine that the plurality of oscillation circuits for evaluation 101 have the same oscillation frequency only by determining that a pattern obtained by Fourier transform has one maximum value in a designed oscillation frequency part. Thus, it can be determined that there are no variations in characteristics of semiconductor elements and processing of a pattern depending on the position on a substrate.

In the invention, semiconductor elements and wires of an oscillation circuit for evaluation are formed at the same time as semiconductor elements and wires of a semiconductor device such as a display device and a logic circuit device. In addition, oscillation circuits for evaluation are dispersed over a substrate. Accordingly, if there are large variations in oscillation frequency of each oscillation circuit for evaluation in the invention, it is suggested that there are large variations in parasitic capacitance and parasitic resistance of wires and electrical characteristics of semiconductor elements constituting a semiconductor device such as a display device and a logic circuit device. When acceptable variations to a semiconductor device such as a display device and a logic circuit device are obtained in advance, defects can be determined by measuring the combined oscillation circuit for evaluation of the invention.

When the oscillation frequency is obtained by measuring the measuring terminals 900 one by one in conventional technologies, variations in measuring instrument or errors in reading may decrease accuracy. In the invention, the oscillation frequencies of the plurality of oscillation circuits for evaluation 101 are simultaneously obtained by the measuring terminal 100; therefore, the oscillation frequencies of the plurality of oscillation circuits for evaluation 101 can be compared with higher accuracy than in conventional technologies.

In conventional technologies, it takes time and effort to measure each of oscillation circuits for evaluation separately and errors may be caused by the separated measurements.

On the other hand, the invention is advantageous in that a plurality of oscillation circuits for evaluation can be simultaneously measured.

In the invention, a plurality of oscillation circuits for evaluation may be constituted by semiconductor elements with different electrical characteristics.

Embodiment Mode 2

Figure 2:
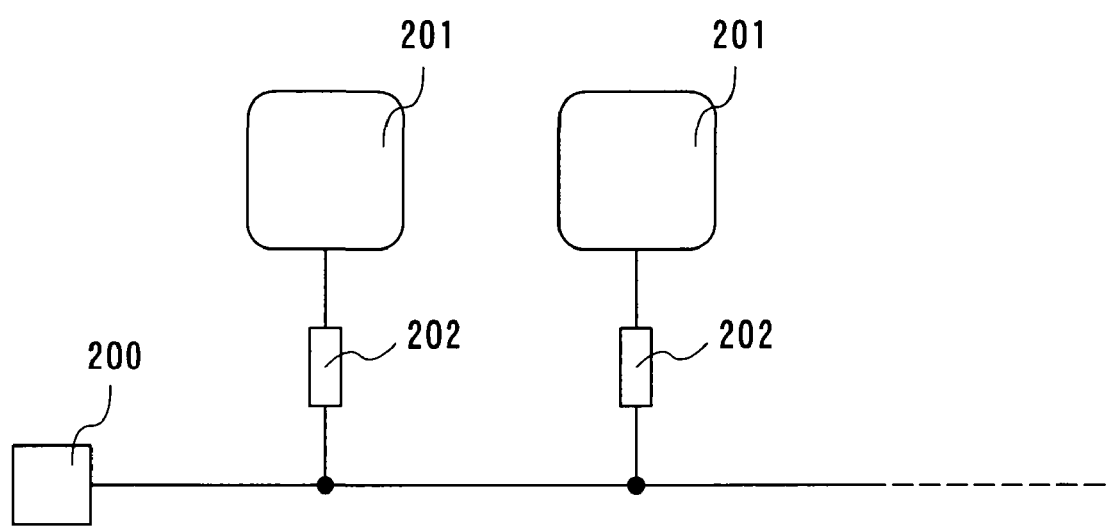
FIG. 2 is a diagram showing a structure of another mode of the invention.

In this embodiment mode, a structure of another mode of the invention is described. In FIG. 2, each of oscillation circuits for evaluation 201 has an output signal line that is connected to a measuring terminal 200 through an element 202 such as a resistor and a capacitor. The oscillation circuits for evaluation 201 have the same structure as the oscillation circuits for evaluation 101.

In FIG. 2, an output buffer for directly changing the potential at an output node of each of the oscillation circuits for evaluation 201 may be constituted by a CMOS (Complementary Metal Oxide Semiconductor) inverter element. When the output nodes of a plurality of CMOS inverter elements are directly connected to each other, a larger current flows to the inverter elements than that flowing to inverter elements having output nodes that are not connected to each other. Direct connection means connection without through an element such as a capacitor and a resistor that is not parasitic resistance.

The oscillation circuits for evaluation 201 can be separated by the elements 202 such as a resistor and a capacitor because of an extremely low voltage drop of a power supply caused by a current flowing to the inverter elements having output nodes connected to each other. Accordingly, the elements 202 such as a resistor and a capacitor are preferably designed so that a voltage drop of a power supply is extremely low.

In Embodiment Mode 1 where the elements 202 such as a resistor and a capacitor are not used, output buffers constituting the oscillation circuits for evaluation 101 are required to be designed so that a voltage drop of a power supply is extremely low. Such a design limitation can be eliminated in this embodiment mode where the oscillation circuits for evaluation are connected to the measuring terminal through the elements such as a resistor and a capacitor.

In the invention, each of the plurality of oscillation circuits for evaluation may be constituted by semiconductor elements with different electrical characteristics.

Embodiment Mode 3

In this embodiment mode, an element substrate used for performing the test methods shown in Embodiment Modes 1 and 2 is described.

Figure 15A:
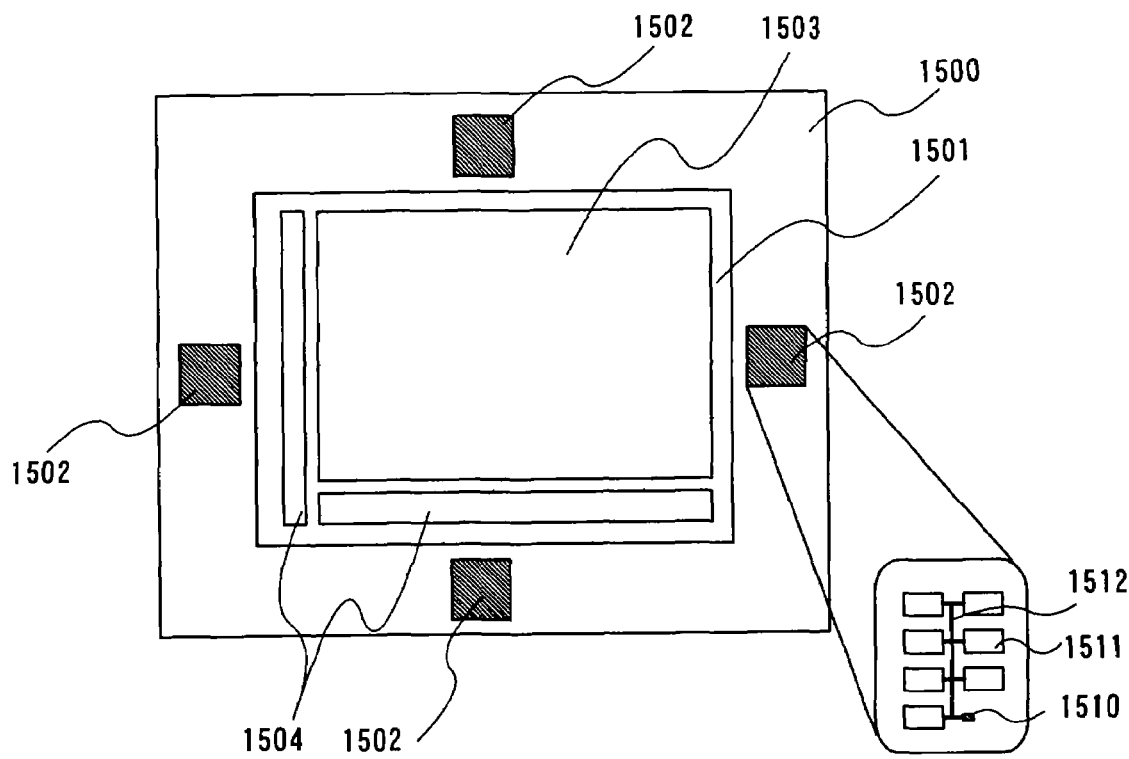
FIGS. 15A and 15B are schematic diagrams of a semiconductor device of the invention.
Figure 15B:
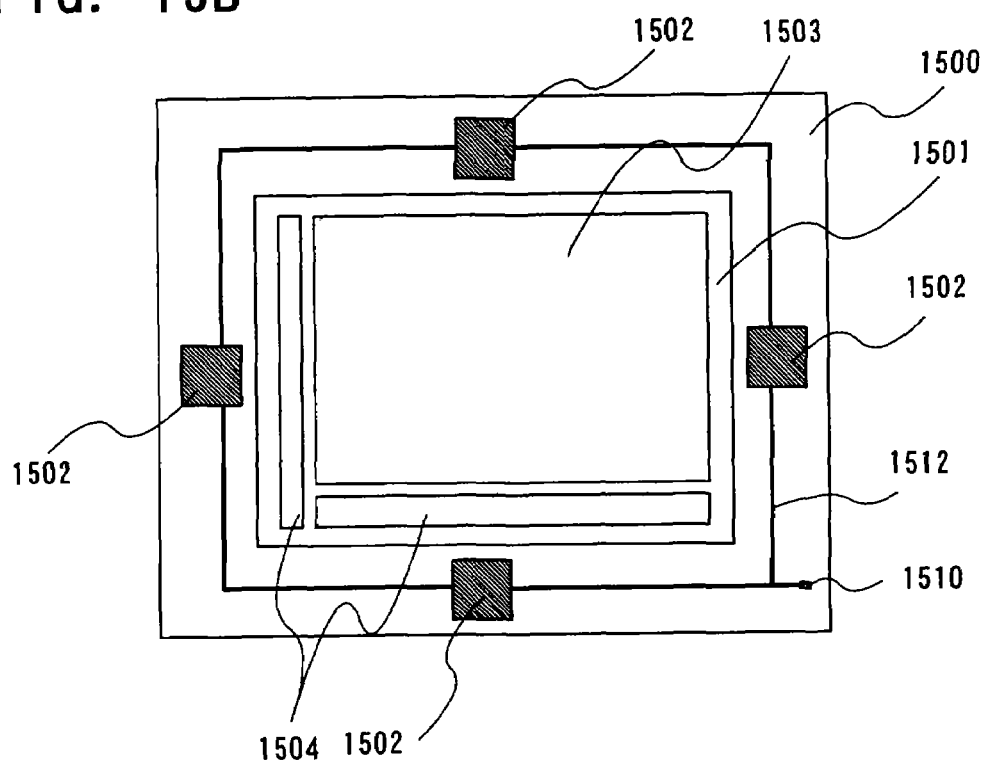

FIG. 15A is a top view of an element substrate over which a semiconductor device of the invention is provided. In FIGS. 15A and 15B, a display device 1501 including a pixel portion 1503 and driver circuit portions 1504 is formed over a substrate 1500 such as a glass substrate. At least one oscillation circuit for evaluation 1502 of the invention is disposed at the periphery of the display device 1501. The oscillation circuit for evaluation 1502 may also be disposed within the display device 1501 if there is a space.

The oscillation circuit for evaluation 1502 has an oscillation circuit 1511 such as a ring oscillator, a common wire 1512 for connecting the oscillation circuit 1511, and a measuring terminal 1510 connected to the common wire. The test method of the invention can be performed by applying a probe to the measuring terminal 1510.

A plurality of the oscillation circuits for evaluation 1502 are desirably arranged to be dispersed in as large an area as possible over the substrate 1500. When the plurality of oscillation circuits for evaluation 1502 are arranged to be dispersed at the periphery of the display device 1501, the electrical characteristics of semiconductor elements in the display device 1501 can be estimated with higher accuracy than in the case where only one oscillation circuit for evaluation 1502 is provided or the oscillation circuits for evaluation 1502 are concentrated in one place.

When the oscillation circuit for evaluation 1502 is disposed within the display device 1501, the electrical characteristics of semiconductor elements in the display device 1501 can be estimated by the oscillation circuit for evaluation 1502 with higher accuracy than in the case where the oscillation circuits for evaluation 1502 are disposed only at the periphery of the display device 1501.

In the invention, the oscillation circuit for evaluation 1502 is disposed as a circuit independently from the display device 1501. The oscillation circuit for evaluation 1502 may be cut off when the display device 1501 is completed.

Although FIG. 15A shows the oscillation circuit for evaluation 1502 where a plurality of oscillation circuits for evaluation are connected to each other, the invention is not limited to this, and all of the oscillation circuits for evaluation dispersed over the substrate may be connected to one measuring terminal as shown in FIG. 15B. When all of the oscillation circuits for evaluation are connected to one measuring terminal, the oscillation circuits for evaluation dispersed over the entire substrate can be simultaneously measured by measuring a change in potential by applying a probe to the one measuring terminal, which allows evaluation of variations in electrical characteristics of semiconductor elements and the like to be evaluated easily in a short time.

According to the test method using the oscillation circuit for evaluation of the invention, evaluation can be performed in a short time, leading to increase in productivity.

Embodiment 1

Figure 3:
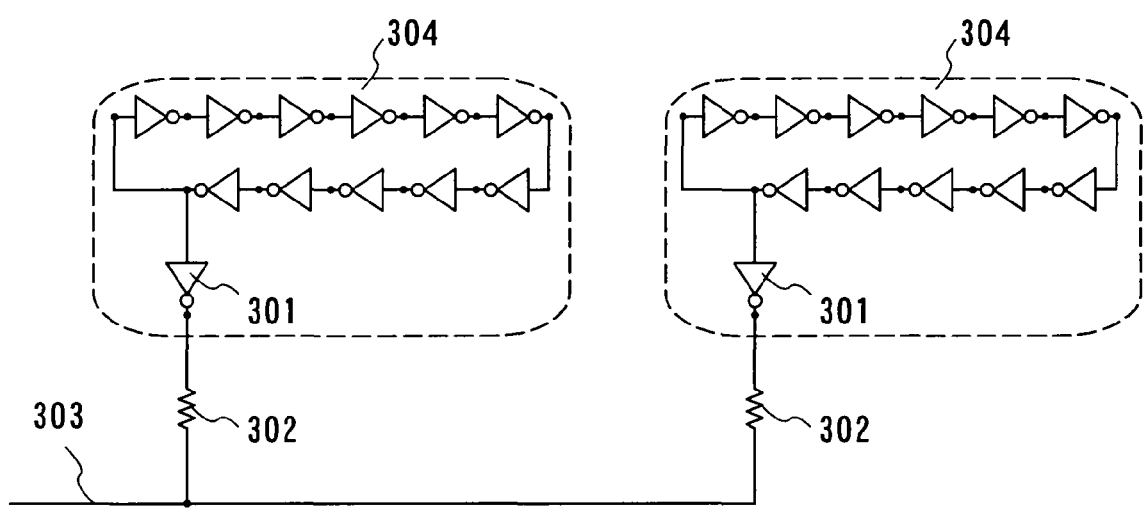
FIG. 3 is a circuit diagram showing an embodiment mode of the invention.

This embodiment shows a circuit diagram of an oscillation circuit for evaluation that is constituted by a ring oscillator. FIG. 3 corresponds to the structure shown in FIG. 2. In FIG. 3, two ring oscillators are connected through a resistor 302. In the invention, the oscillation circuit for evaluation is not limited to the ring oscillator, and may be a PLL, a VCO, or an LC oscillation circuit. This embodiment shows the case of the ring oscillator. In the invention, the number of oscillation circuits for evaluation may be two or more, and this embodiment shows the case where two ring oscillators are provided.

In FIG. 3, each of ring oscillators 304 is constituted by 11 inverter elements, and includes an inverter element as an output buffer 301. Note that the number of inverter elements constituting the ring oscillator is not limited to 11, and the ring oscillator may be constituted by an odd number of inverter elements. If a ring oscillator is constituted by a small number of inverters, the ring oscillator does not oscillate in some cases depending on the electrical characteristics of a wire such as parasitic capacitance and the electrical characteristics of semiconductor elements constituting the inverters. Therefore, the ring oscillator is constituted by a plurality of inverters.

If the output buffer 301 is not provided in FIG. 3, the oscillation frequency of one ring oscillator changes due to the influence of the other ring oscillator. If the output buffer 301 is not provided in FIG. 3, an output of one ring oscillator is inputted to the other ring oscillator, and thus the two ring oscillators oscillate with the same frequency and the same phase. The invention is intended to measure variations in oscillation frequencies of a plurality of oscillation circuits for evaluation, and it is not desirable that the plurality of oscillation circuits for evaluation influence each other to have the same oscillation frequency. Accordingly, the output buffer 301 is provided in FIG. 3. The output buffer 301 may be constituted by a plurality of inverter elements or an operational amplifier.

In general, measurement with a measuring needle is performed using capacitive coupling so as not to influence the potential of a measured object. Therefore, it is desirable that the resistance of the resistor 302 be not too large to measure the oscillation frequency efficiently in view of the capacitance, parasitic capacitance, and parasitic resistance of the measuring needle.

On the other hand, if the resistance of the resistor 302 is small and the two oscillation circuits for evaluation have different outputs, a large current flows to the output buffer 301 in FIG. 3. Therefore, it is desirable that the resistance of the resistor 302 be not too small and have a certain level of resistance.

In order to facilitate the evaluation, it is desirable that a power supply wire and a ground wire that are not shown in the circuit diagram do not influence much the oscillation frequencies of the oscillation circuits for evaluation. In order to reduce the influence of the power supply wire and the ground wire on the oscillation frequencies of the oscillation circuits for evaluation, the power supply wire and the ground wire are designed so as not to vary much and to be supplied with enough power to recover the potential faster than the oscillation period. In order to be supplied with enough power, the power supply wire and the ground wire are designed to be short in length or large in width, or made of a low resistance material so as to have low resistance. In addition, a capacitor is formed to remove the high frequency component of a change in power supply generated in the power supply wire and the ground wire.

In the structure of FIG. 3, the resistor 302 that is not a parasitic resistor can be omitted if the current capacity and power supply capacity of the output buffer 301 are fully taken into consideration.

Figure 4:
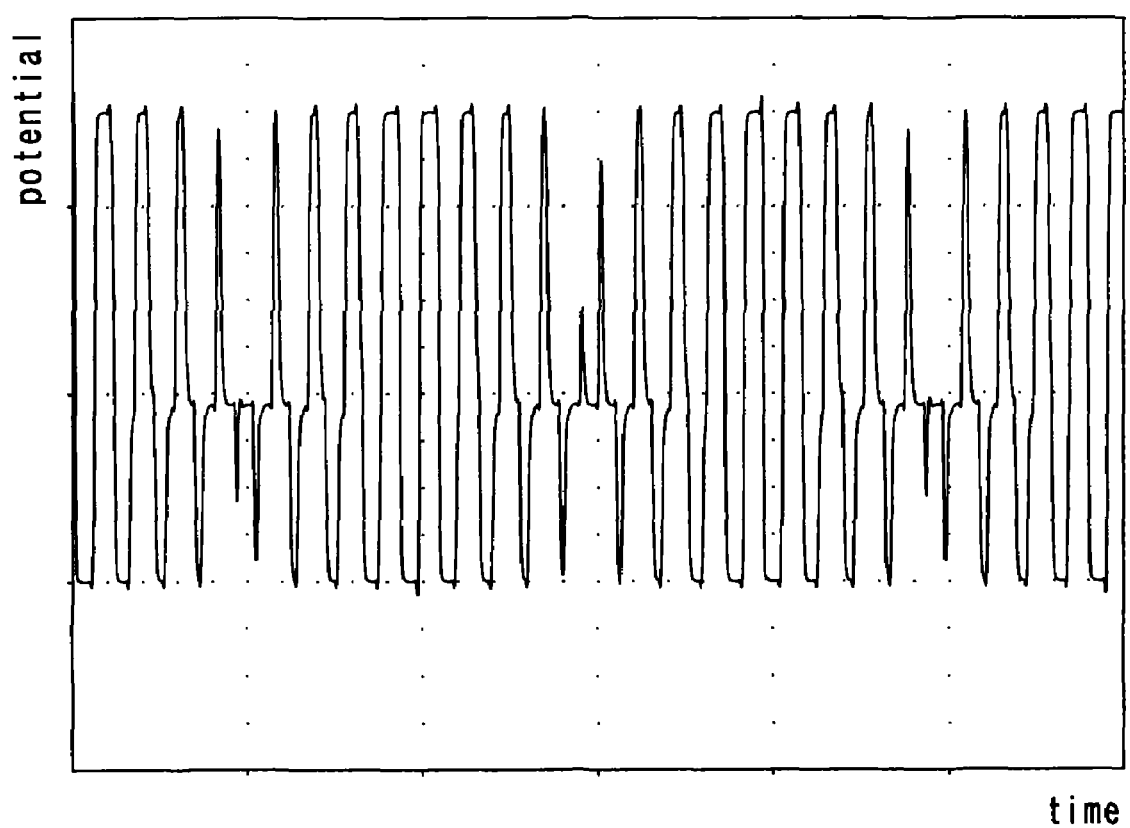
FIG. 4 is a diagram showing a waveform of a change in potential at a node 303 of FIG. 3, which is measured when a plurality of oscillation circuits oscillate with different frequencies.

FIG. 4 shows a waveform obtained by measuring a change in potential of a wire (hereinafter referred to as a node) 303 in FIG. 3. Description is made with reference to the calculation results where the phase and frequency can be modified easily. In fact, a change in potential is measured by applying a probe to a measuring terminal corresponding to the node 303. FIG. 4 shows a waveform in the case where the two ring oscillators 304 oscillate with different frequencies. That is, FIG. 4 shows the case where the oscillation circuits for evaluation designed to oscillate with the same frequency oscillate with different frequencies since variations in characteristics and processing of semiconductor elements over a substrate are caused in forming steps of the semiconductor elements and wires. In FIG. 4, the abscissa denotes time while the ordinate denotes the potential at the node 303. The two ring oscillators 304 with different frequencies output beat signals.

Figure 5:
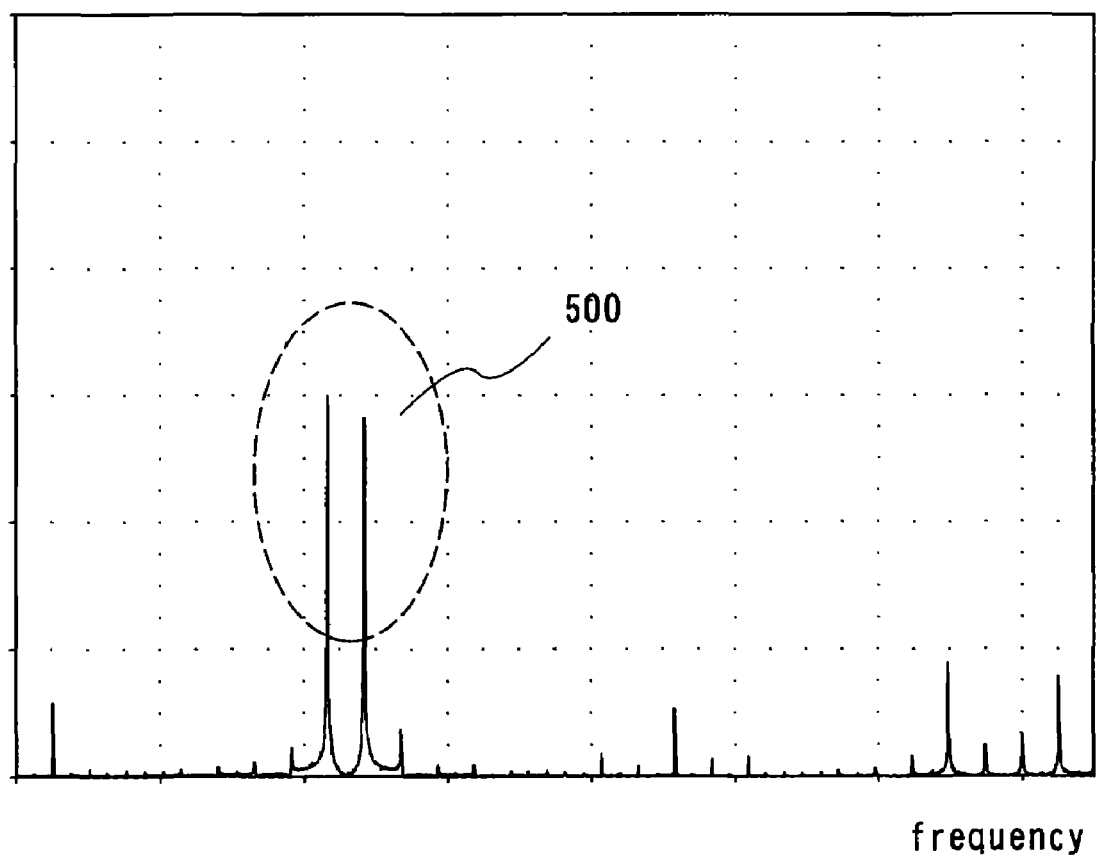
FIG. 5 is a diagram obtained by Fourier transforming the waveform shown in FIG. 4.

FIG. 5 shows the result of Fourier transform of the waveform in FIG. 4. The oscillation frequency can be easily observed by Fourier transform. The abscissa denotes frequency. Two maximum values 500 represent different oscillation frequencies of the two ring oscillators 304. Maximum values other than the two maximum values 500 represent the frequency components of non-sinusoidal output waveforms of the ring oscillators 304.

Figure 6:
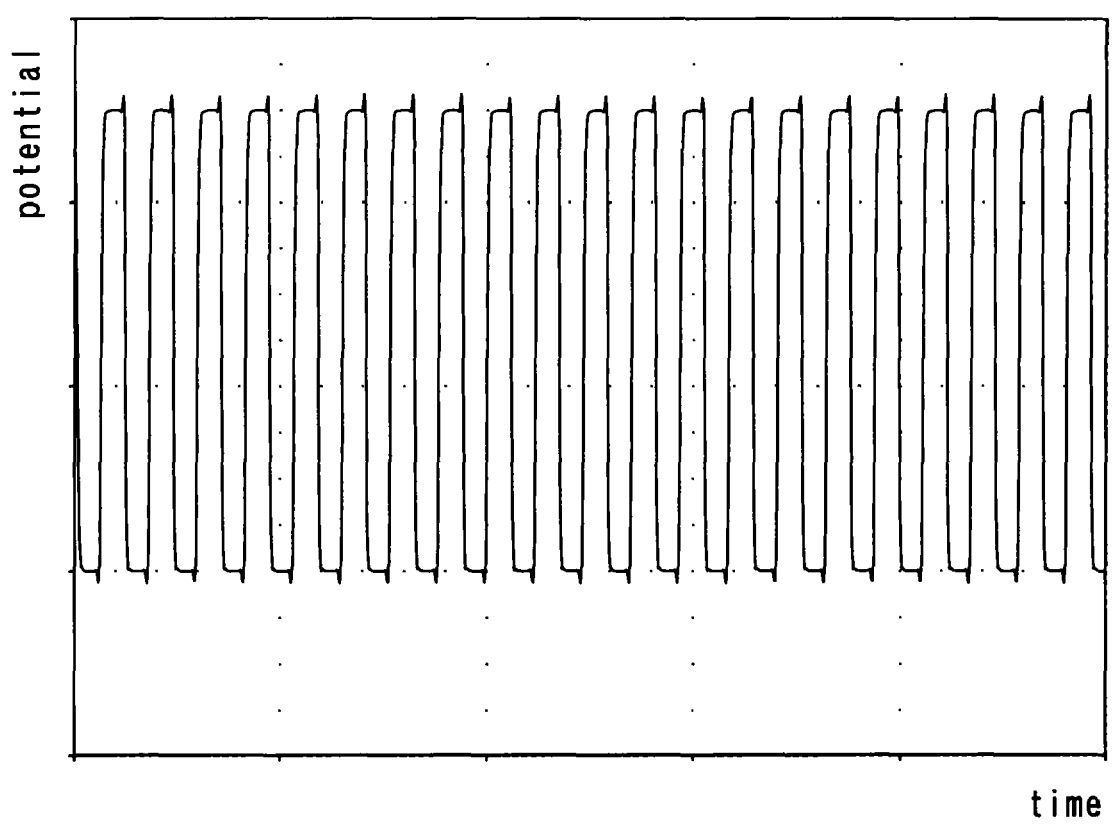
FIG. 6 is a diagram showing a waveform of a change in potential at a node 303 of FIG. 3, which is measured when a plurality of oscillation circuits oscillate with the same frequency.

FIG. 6 shows a waveform obtained by measuring a change in potential at the node 303 in FIG. 3. FIG. 6 shows the waveform in the case where the two ring oscillators 304 oscillate with the same frequency and the same phase. That is, FIG. 6 shows the case where the oscillation circuits for evaluation designed to oscillate with the same frequency oscillate with the same frequency since variations in characteristics and processing of semiconductor elements over a substrate are not caused in forming steps of the semiconductor elements and wires. FIG. 6 also shows the case where the ring oscillators 304 happen to oscillate with the same phase since the ring oscillators 304 shown in FIG. 3 cannot control the oscillation phase. In FIG. 6, the abscissa represents time while the ordinate represents the potential at the node 303.

Figure 7:
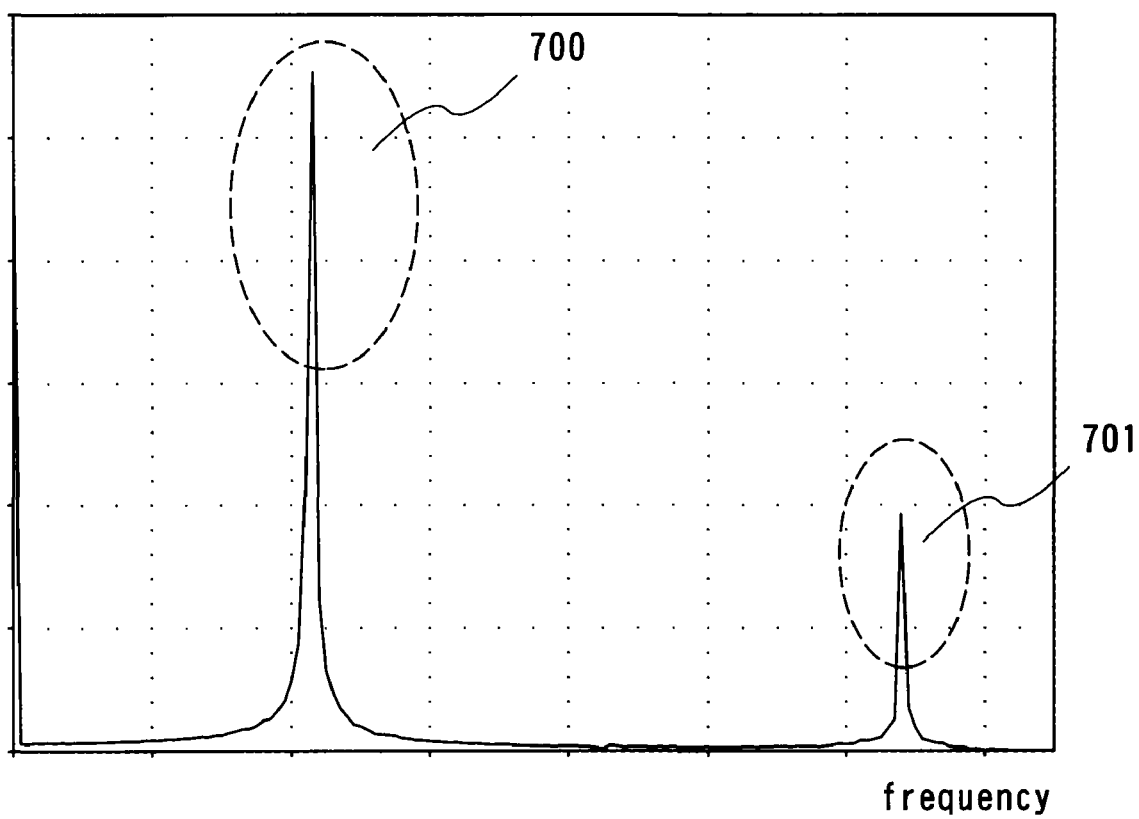
FIG. 7 is a diagram obtained by Fourier transforming the waveform shown in FIG. 6.

FIG. 7 shows the result of Fourier transform of the waveform in FIG. 6. The oscillation frequency of the waveform in FIG. 6 can be obtained even without Fourier transform, though it is Fourier transformed for comparison with FIG. 5. The oscillation frequency can be observed easily by Fourier transform. The abscissa represents frequency. The oscillation frequency of the ring oscillators 304 has two maximum values 700. A maximum value 701 represents a frequency three times as high as the frequency of the maximum values 700, which is caused by non-sinusoidal output waveforms of the ring oscillators 304.

If the two ring oscillators 304 in FIG. 3 have the same shape or the same oscillation frequency and are disposed at different positions over the substrate, the result of Fourier transform, which has one maximum value at the vicinity of the oscillation frequency of the respective ring oscillators as shown in FIG. 7, shows that there are few variations in the two ring oscillators disposed at different positions over the substrate.

If the two ring oscillators 304 in FIG. 3 oscillate with the same frequency and different phases, a change in potential at the node 303 has a period when outputs of the two ring oscillators 304 cancel each other. In the case of oscillating in antiphase, the two ring oscillators cannot have an amplitude large enough to Fourier transform. In fact, there is a low probability that the two ring oscillators oscillate in antiphase to the extent that an amplitude large enough to Fourier transform cannot be obtained. In the case of three or more ring oscillators, the probability that outputs of the three or more ring oscillators cancel each other to the extent that an amplitude large enough to Fourier transform cannot be obtained is much lower than that in the case of the two ring oscillators.

Figure 8:
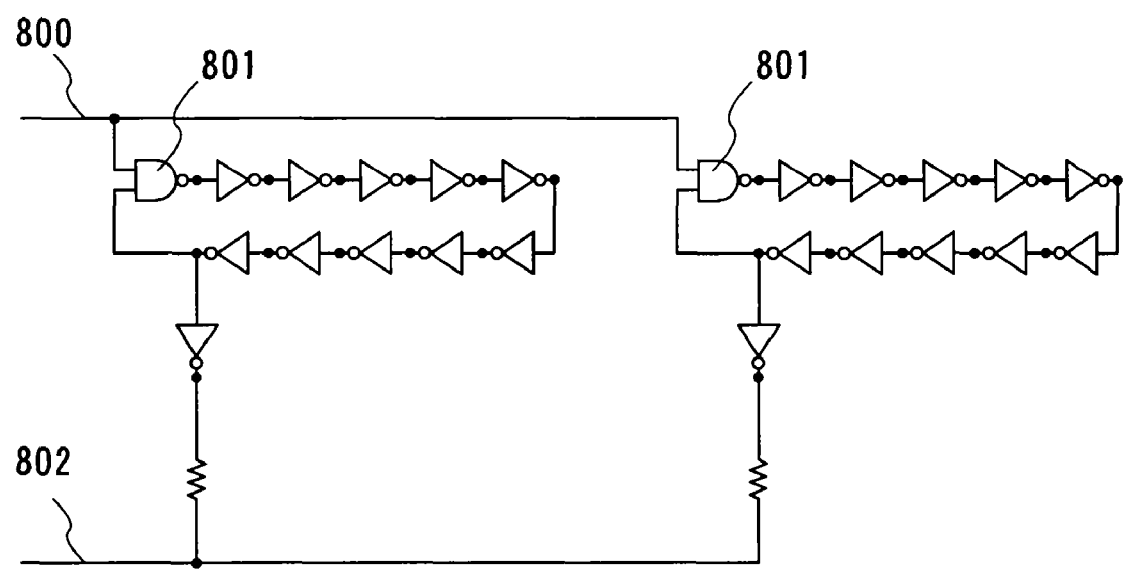
FIG. 8 is a circuit diagram obtained by changing the ring oscillator shown in FIG. 3 so as to synchronize.

In order to prevent the two ring oscillators with the same frequency from oscillating in antiphase, a circuit for synchronizing the oscillation of the two ring oscillators may be additionally provided. In FIG. 8, a NAND 801 is provided instead of one of the 11 inverters constituting the ring oscillator 304 in order to synchronize the oscillation of the two ring oscillators. In FIG. 8, oscillation starts when the potential at a node 800 rises from a ground potential to a power supply potential; therefore, the oscillation of the two ring oscillators is synchronized. When a change in potential at a node 802 is measured in FIG. 8, a waveform where there is little cancellation as shown in FIG. 6 can be obtained.

The circuit for synchronizing the oscillation of the two ring oscillators is not limited to a NAND, and may be a NOR or a clocked inverter. The NAND 801 may be provided instead of any one of the 11 inverters constituting the ring oscillator 304 in order to synchronize the oscillation of the two ring oscillators.

Embodiment 2

In this embodiment, manufacturing steps of a semiconductor device using the test method of the invention are described.

A base film is provided over an insulating substrate. Thin film transistors are formed over the insulating substrate with the base film interposed therebetween. The thin film transistors can be used as elements of a pixel portion or a driver circuit portion of the semiconductor device. Each of the thin film transistors includes an island shaped semiconductor film, and a gate electrode provided thereover with a gate insulating film interposed therebetween. It is preferable to provide an insulator (a so-called side wall) on each side surface of the gate electrode, so that the side wall can prevent short channel effects. The semiconductor film is formed to have a thickness of 0.2 µm or less, typically 40 to 170 nm, and preferably 50 to 150 nm. Further, the thin film transistor includes an insulating film covering the semiconductor film, and an electrode connected to an impurity region formed in the semiconductor film. Note that the electrode connected to the impurity region can be provided by forming a contact hole in the insulating film such as a gate insulating film, forming a conductive film in the contact hole, and processing the conductive film.

The semiconductor film can be formed of amorphous silicon or polycrystalline silicon. If polycrystalline silicon is used, it can be obtained by forming amorphous silicon and then applying heat treatment or laser irradiation thereto. At this time, the crystallization temperature can be lowered by applying heat treatment or laser irradiation using a metal element typified by nickel. Laser irradiation can be performed using a continuous wave or pulsed laser irradiation apparatus. Alternatively, a crystallization method using heat treatment may be combined with a crystallization method using a continuous wave laser beam or a laser beam emitted with a repetition rate of 10 MHz or higher. Irradiation with a continuous wave laser beam or a laser beam emitted with a repetition rate of 10 MHz or higher allows the surface of the crystallized semiconductor film to be planarized. As a result, the gate insulating film can be reduced in thickness, and the withstand voltage of the gate insulating film can be improved.

When the semiconductor film is crystallized by being irradiated with a continuous wave laser beam or a laser beam emitted with a repetition rate of 10 MHz or higher while being scanned in one direction, crystals grow in the scan direction of the laser beam. By disposing the transistor so that the scan direction is the same as the channel length direction (direction in which carriers flow in a channel forming region), and using a gate insulating film described below in combination, a transistor (TFT) with few variations in characteristics and high field effect mobility can be obtained.

In the semiconductor device of the invention, the insulating film typified by a gate insulating film and the like can be manufactured by a high density plasma process. The high density plasma process is a plasma process with a plasma density of $1\times10^{11}$ cm$^{-3}$ or higher, and preferably $1\times10^{11}$ cm$^{-3}$ to $9\times10^{15}$ cm$^{-3}$, which uses high frequency waves such as microwaves (e.g., a frequency of 2.45 GHz). When plasma is generated under such conditions, a low electron temperature of 0.2 to 2 eV is obtained. Such a high density plasma with a feature of a low electron temperature has a low kinetic energy of active species; therefore, a film with less plasma damage and defects can be formed. In a chamber capable of performing such a plasma process, an object to be formed, that is a substrate provided with an island shaped semiconductor film if a gate insulating film is formed, is disposed. Then, deposition is performed with the distance between an electrode for generating plasma, a so-called antenna, and the object to be formed kept 20 to 80 mm, and preferably 20 to 60 mm. Such a high density plasma process allows a low temperature process (with a substrate temperature of 400° C. or lower). Accordingly, deposition over a plastic substrate with a low heat resistance can be performed.

Such an insulating film can be deposited in a nitrogen atmosphere or an oxygen atmosphere. The nitrogen atmosphere is typically a mixed atmosphere of nitrogen and rare gas, or a mixed atmosphere of nitrogen, hydrogen, and rare gas. As the rare gas, at least one of helium, neon, argon, krypton, and xenon can be used. The oxygen atmosphere is typically a mixed atmosphere of oxygen and rare gas, a mixed atmosphere of oxygen, hydrogen, and rare gas, or a mixed atmosphere of dinitrogen monoxide and rare gas. As the rare gas, at least one of helium, neon, argon, krypton, and xenon can be used.

The thus formed insulating film causes less damage to other films and can be densified. In addition, the insulating film formed by the high density plasma process can improve the interface with a film in contact with the insulating film. For example, when the gate insulating film is formed by the high density plasma process, the interface with the semiconductor film can be improved. As a result, the electrical characteristics of the thin film transistor can be improved. In addition, the insulating film formed by the high density plasma process has stable characteristics.

Although description is made of the case where the insulating film is formed by the high density plasma process, the semiconductor film may also be formed by the high density plasma process. The high density plasma process allows the surface of the semiconductor film to be modified. As a result, the interface can be improved, leading to improvement in electrical characteristics of the thin film transistor. In addition, the thin film transistor formed by the high density plasma process has stable electrical characteristics.

A semiconductor device such as a display device constituted by thin film transistors, and an oscillation circuit for evaluation of the invention that is formed over the same substrate and at the same time as the semiconductor device such as the display device are manufactured by, for example, forming a semiconductor film and a gate insulating film by the high density plasma process and then forming a gate electrode and wires connected to the semiconductor film.

The oscillation circuits for evaluation of the invention can be measured by applying a probe after forming a circuit with wires, similarly to the conventional single oscillation circuit for evaluation. The wiring layer is not limited to one layer, and a measuring terminal of each of the multilayer wires may appear on the surface to be measured by a probe after an oscillation circuit is formed of the first layer wire, thereby evaluating the influence of each wiring layer forming step. This evaluation can also be performed by the conventional test method for the oscillation circuit; however, according to the invention, a plurality of oscillation circuits for evaluation can be measured more easily for evaluating the influence of variations than by the conventional method.

A test method with higher accuracy is required for evaluating the thin film transistor including an insulating film and a semiconductor film that are formed by the high density plasma process. According to the invention, a plurality of oscillation circuits for evaluation over a substrate can be simultaneously measured; therefore, measurement errors can be reduced and a stable semiconductor device such as a display device and a logic circuit device can be provided.

Embodiment 3

In this embodiment, a layout of a semiconductor device using the evaluation method of the invention is described.

Figure 10:
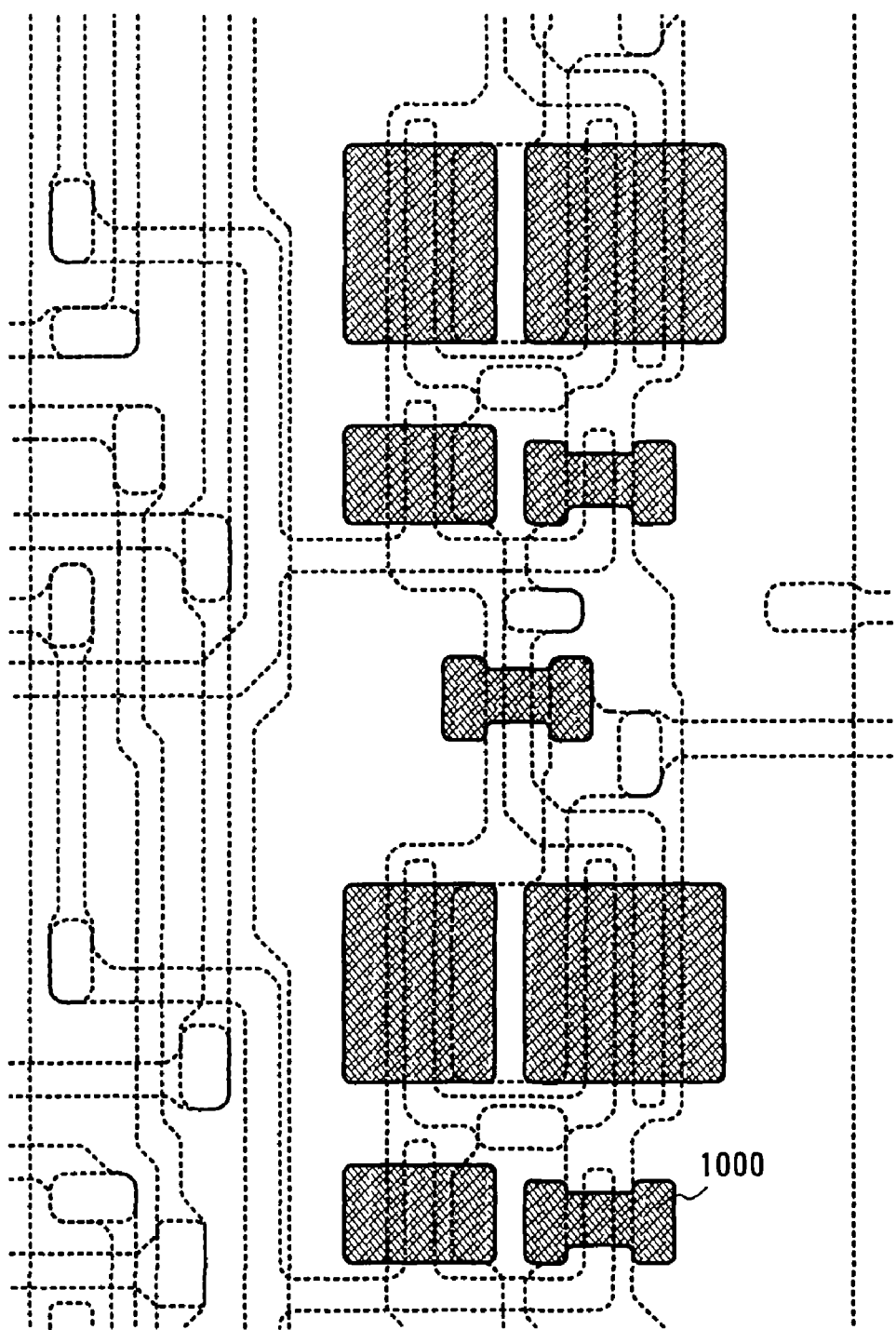
FIG. 10 is a layout of a semiconductor layer in a semiconductor device of the invention.

In a thin film transistor of the invention, a photomask for forming a semiconductor layer has a pattern. This pattern of the photomask has a corner that is rounded by removing a right triangle with one side of 10 µm or shorter in a corner portion. The shape of this mask pattern can be transferred as a pattern of a semiconductor layer 1000 as shown in FIG. 10. The mask pattern may be transferred to the semiconductor layer so that the corner of the semiconductor layer is more rounded than the corner of the mask pattern. In other words, the semiconductor layer may have a pattern with a corner that is more rounded than the corner of the mask pattern. Note that in FIG. 10, gate electrodes and wires formed later are denoted by dotted lines.

Then, a gate insulating film is formed over the semiconductor layer processed to have a rounded corner. A gate electrode and a gate wire are formed to overlap the semiconductor layer partially. The gate electrode or the gate wire can be formed by forming a metal layer or a semiconductor layer by photolithography.

Figure 11:
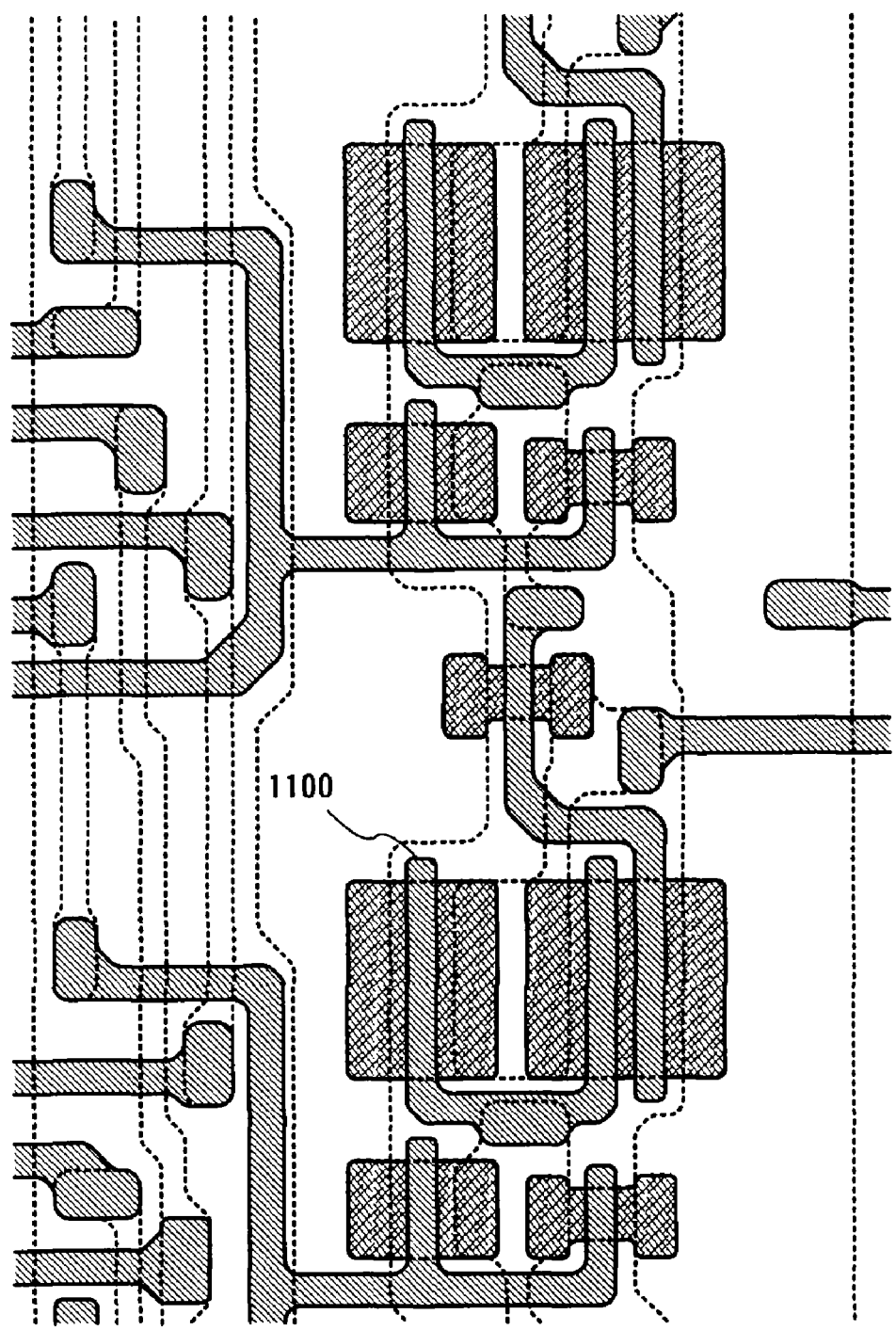
FIG. 11 is a layout of a gate electrode or a gate wiring layer in a semiconductor device of the invention.

A photomask for forming the gate electrode or the gate wire has a pattern. This pattern of the photomask has a corner where a length of equal to or longer than one-fifth the width of the wire and equal to or shorter than half the width of the wire is removed in a corner portion. The shape of this mask pattern can be transferred as a pattern of a gate electrode or a gate wire 1100 as shown in FIG. 11. The mask pattern may be transferred to the gate electrode or the gate wire so that the corner in a corner portion of the gate electrode or the gate wire is more rounded than the corner of the mask pattern. In other words, the gate electrode or the gate wire may have a pattern with a corner that is more rounded than the corner of the mask pattern. The gate electrode or the gate wire formed using such a photomask can have a corner that is rounded by removing a length of equal to or longer than one-fifth the width of the wire and equal to or shorter than half the width of the wire in the corner portion. Note that in FIG. 11, wires formed later are denoted by dotted lines.

Such a gate electrode or a gate wire is bent into a rectangular shape because of layout limitations. Accordingly, the rounded corner of the gate electrode or the gate wire includes a projecting portion (external side) and a depressed portion (internal side). In the rounded external side, generation of fine powders due to abnormal discharge can be suppressed in dry etching using plasma. Meanwhile, in the rounded internal side of the corner portion, even if fine powder is attached to the substrate, the internal side of the corner portion makes it possible to wash away the fine powder when cleaning without retaining washing liquids in the corner portion in the wire pattern. As a result, yield can be expected to significantly increase.

An insulating layer is formed over the gate electrode or the gate wire. The insulating layer is formed of a single insulating film or a plurality of insulating films.

An opening is formed in a predetermined position of the insulating layer, and a wire is formed in the opening. This opening is provided to electrically connect the wire to the semiconductor layer or the gate wiring layer provided over the lower layer. The wire is formed into a predetermined pattern by etching using a mask pattern formed by photolithography.

The wire can connect specific elements to each other. The wire connecting specific elements is not a straight line but is bent into a rectangular shape because of layout limitations (hereinafter referred to as a curved portion). In addition, the width of the wire may change in the opening or other areas. In the opening, for example, the width of the wire increases if the opening is equal to or larger than the width of the wire. Since the wire also functions as one electrode of a capacitor because of the circuit layout, the width of the wire may be made larger.

In that case, in the corner portion bent into a rectangular shape of the mask pattern, the corner of the wire can be rounded by removing a right triangle with one side of 10 µm or shorter, or equal to or longer than one-fifth the width of the wire and equal to or shorter than half the width of the wire. A wire pattern 1200 has a corner portion of such the mask pattern. That is to say, the circumference of the wire in the corner portion is curved when seen from above. Specifically, in order to form a round circumference of the corner portion, a part of the wire is removed, which corresponds to an isosceles right triangle having two first straight lines that are perpendicular to each other making the corner portion, and a second straight line that makes an angle of about 45 degrees with the two first straight lines. When removing the triangle, two obtuse angles are formed in the wire. At this time, the wire is preferably etched by appropriately adjusting the etching conditions and/or a mask design so that a curved line in contact with the first straight line and the second straight line is formed in each obtuse angle part. Note that the length of the two sides of the isosceles right triangle, which are equal to each other, is equal to or longer than one-fifth the width of the wire and equal to or shorter than half the width of the wire. In addition, the inner circumference of the corner portion is also made curved in accordance with the circumference of the corner portion. In the external side in the corner portion of such a rounded wire, generation of fine powders due to abnormal discharge can be suppressed in dry etching using plasma. Meanwhile, in the internal side, even if fine powder is attached to the substrate, the internal side of the corner portion makes it possible to wash away the fine powder when cleaning without retaining washing liquids in the corner portion in the wire pattern. As a result, such a rounded wire has the effect that yield can be expected to significantly increase. Thus is also advantageous that when multiple parallel wires are provided over the substrate, fine powder attached to the substrate can be easily washed away. The wire with a rounded corner can also allow electrical conduction.

Figure 12:
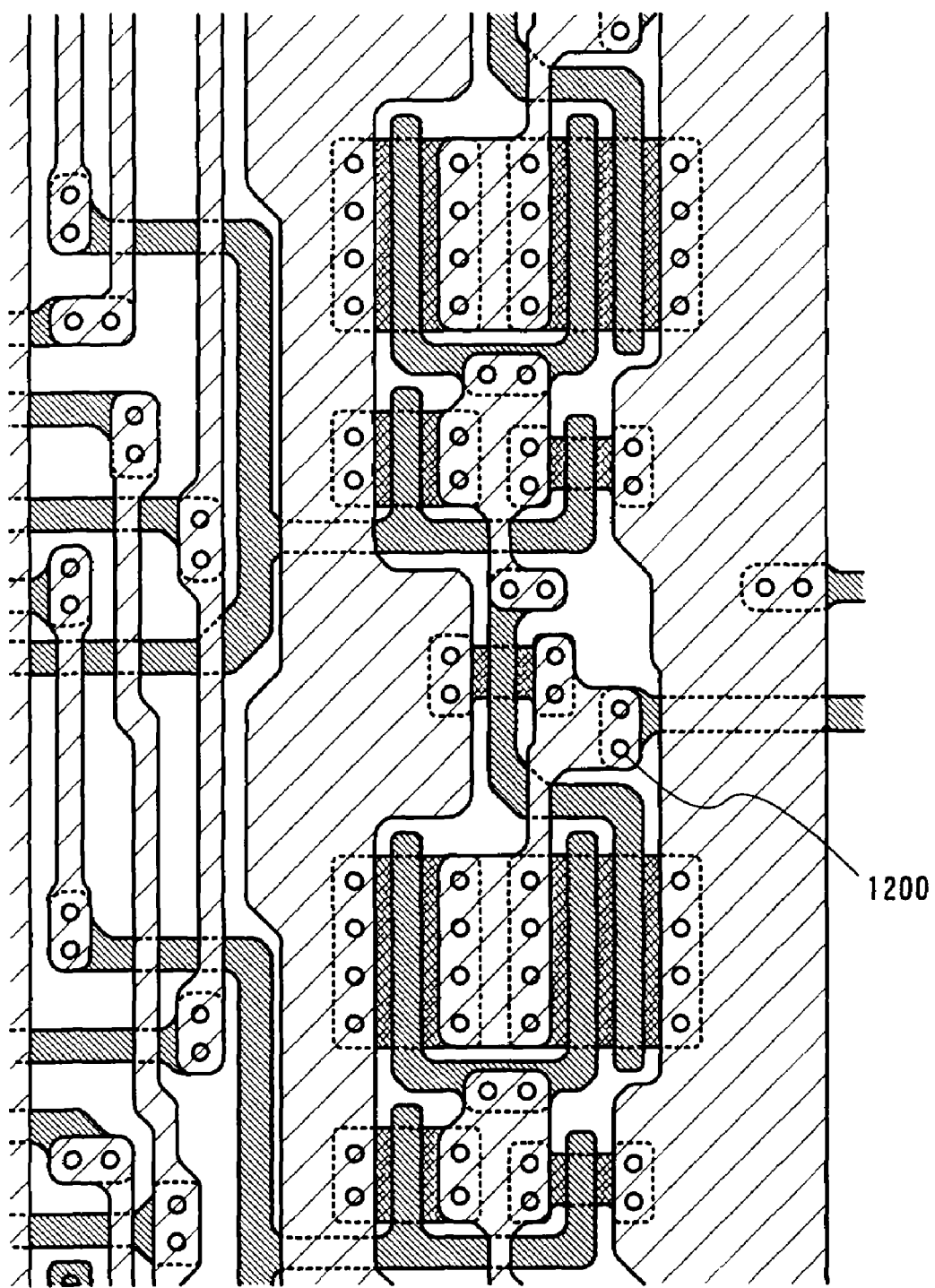
FIG. 12 is a layout of a wiring layer in a semiconductor device of the invention.

In the circuit having the layout shown in FIG. 12, the corner portion and the portion where the wire width changes are smoothed and curved, thereby generation of fine powders due to abnormal discharge can be suppressed in dry etching using plasma. In addition, even if fine powder is attached to the substrate, the internal side of the corner portion makes it possible to wash away the fine powder when cleaning without retaining washing liquids in the corner portion in the wire pattern. As a result, yield can be expected to significantly increase. That is to say, the problems of dusts and fine powders in manufacturing steps can be solved. Further, the wire with a rounded corner allows electrical conduction. In particular, it is highly advantageous to wash dusts in wires in a driver circuit portion and the like including multiple parallel wires.

Although this embodiment shows the mode where the corner or the corner portion is rounded in the three layouts of the semiconductor layer, the gate wire, and the wire, the invention is not limited to this. That it to say, it is only required that the corner or the corner portion in any one of the layers is rounded to solve the problems of dusts and fine powders in manufacturing steps.

According to the mode described in this embodiment where the corner or the corner portion is rounded, the yield of a semiconductor device such as a display device and a logic circuit device increases and the electrical characteristics thereof are improved. In order to evaluate the increased yield, it is effective to measure many oscillation circuits for evaluation provided to be dispersed over a substrate. This measurement takes time using the conventional evaluation method; however, according to the invention, many oscillation circuits for evaluation can be evaluated with a smaller number of measurements.

Embodiment 4

In this embodiment, manufacturing steps of a semiconductor device using the evaluation method of the invention are described.

Figure 13:
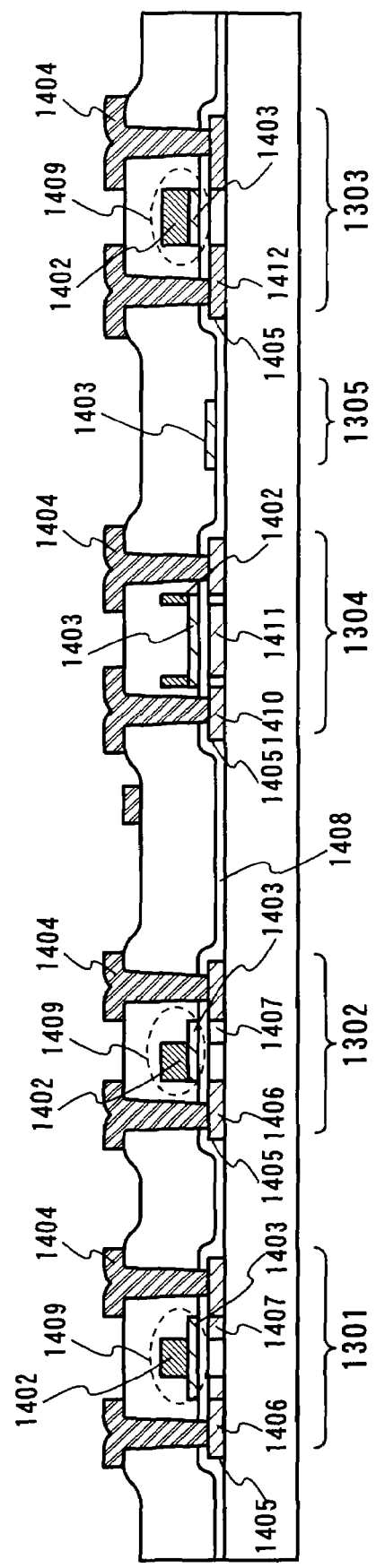
FIG. 13 is a cross sectional view of a transistor.

An oscillation circuit for evaluation of the invention and a semiconductor device formed at the same time as the oscillation circuit for evaluation include transistors. The transistors may be thin film transistors (TFTs) as well as MOS transistors formed over a single crystal substrate. FIG. 13 is a cross sectional view of transistors constituting these circuits. FIG. 13 shows an N-channel TFT 1301, an N-channel TFT 1302, a capacitor 1304, a resistor 1305, and a P-channel transistor 1303. Each of the transistors has a semiconductor layer 1405, an insulating layer 1408, and a gate electrode 1409. The gate electrode 1409 has a stacked layer structure of a first conductive layer 1403 and a second conductive layer 1402. FIGS. 14A to 14E are top views corresponding to the transistors, the capacitor, and the resistor shown in FIG. 13, and can also be referred to.

In FIG. 13, the N-channel TFT 1301 has the semiconductor layer 1405 where impurity regions 1407 doped at a lower concentration than impurity regions 1406 forming source and drain regions in contact with a wire 1404 are formed on both sides of the gate electrode in the channel length direction (direction in which carriers flow). The impurity regions 1407 are also called lightly doped drain (LDD) regions. In the case of the N-channel TFT 1301, the impurity regions 1406 and the impurity regions 1407 are added with an impurity imparting N-type conductivity, such as phosphorus. The LDD regions are formed to suppress hot electron degradation and short channel effects.

Figure 14A:
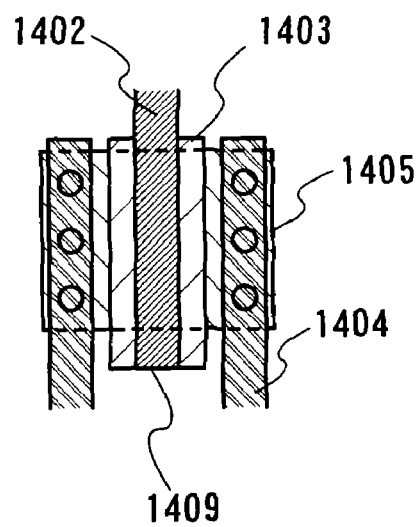
FIGS. 14A to 14E are top views of a transistor.

As shown in FIG. 14A, in the gate electrode 1409 of the N-channel TFT 1301, the first conductive layer 1403 is provided on both sides of the second conductive layer 1402. In this case, the thickness of the first conductive layer 1403 is smaller than that of the second conductive layer 1402. The first conductive layer 1403 is formed to have such a thickness that ion species accelerated with an electric field of 10 to 100 kV pass through. The impurity regions 1407 are formed to overlap the first conductive layer 1403 of the gate electrode 1409. In other words, the LDD regions overlapping the gate electrode 1409 are provided. In this structure, the impurity regions 1407 are formed in a self-alignment manner by adding an impurity of one conductivity type through the first conductive layer 1403 of the gate electrode 1409 using the second conductive layer 1402 as a mask. That is to say, the LDD regions overlapping the gate electrode are formed in a self-alignment manner A transistor having LDD regions on both sides of a gate electrode is applied to a rectifying TFT or a transmission gate (also called an analog switch) used in a logic circuit, thereby constituting a semiconductor device. Such a TFT preferably includes LDD regions on both sides of a gate electrode since positive and negative voltages are applied to source and drain electrodes.

Figure 14B:
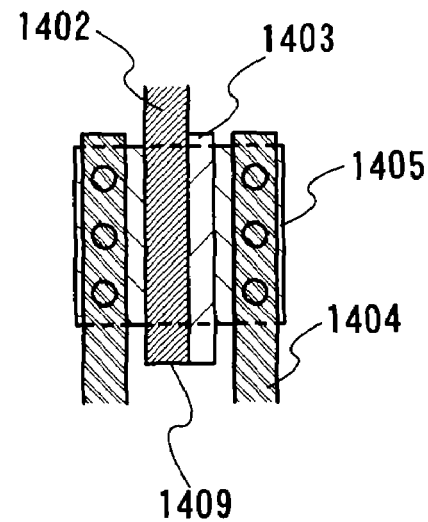

In FIG. 13, the N-channel TFT 1302 has the semiconductor layer 1405 where the impurity region 1407 doped at a lower concentration than the impurity regions 1406 is formed on one side of the gate electrode. As shown in FIG. 14B, in the gate electrode 1409 of the N-channel TFT 1302, the first conductive layer 1403 is provided on one side of the second conductive layer 1402. In this case also, the LDD region can be formed in a self-alignment manner by adding an impurity of one conductivity type through the first conductive layer 1403 using the second conductive layer 1402 as a mask.

A transistor having an LDD region on one side of a gate electrode may be applied to a transistor where only a positive voltage or a negative voltage is applied between source and drain electrodes. Specifically, the transistor having an LDD region on one side of the gate electrode may be applied to a transistor constituting a logic gate such as an inverter circuit, a NAND circuit, a NOR circuit, and a latch circuit, or a transistor constituting an analog circuit such as a sense amplifier, a constant voltage generating circuit, and a VCO.

Figure 14C:
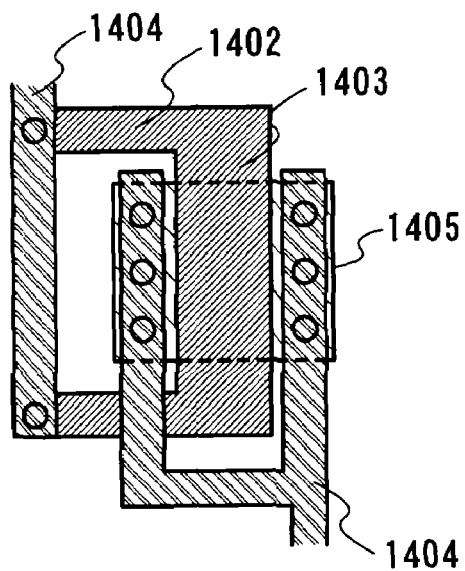
Figure 14D:
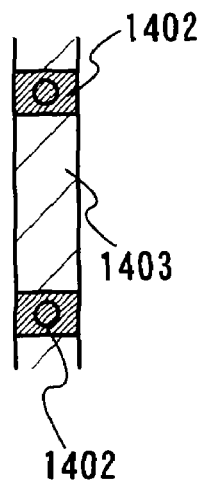
Figure 14E:
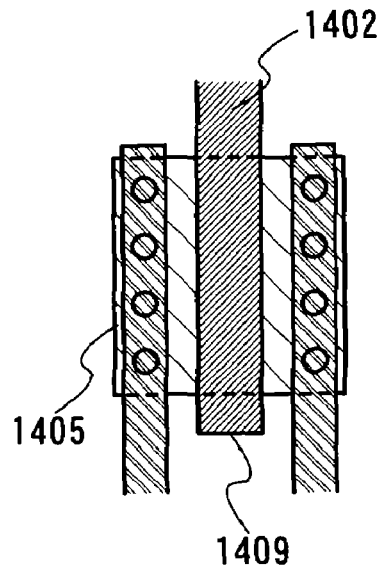

In FIG. 13, the capacitor 1304 has a structure where the insulating layer 1408 is sandwiched between the first conductive layer 1403 and the semiconductor layer 1405. The semiconductor layer 1405 of the capacitor 1304 includes an impurity region 1410 and an impurity region 1411. The impurity region 1411 is formed in the semiconductor layer 1405 so as to overlap the first conductive layer 1403. The impurity region 1410 is in contact with the wire 1404. Since the impurity region 1411 can be added with an impurity of one conductivity type through the first conductive layer 1403, the impurity region 1410 and the impurity region 1411 may contain the same concentration of impurity or different concentrations of impurity. In any case, since the semiconductor layer 1405 of the capacitor 1304 functions as an electrode, it is preferably added with an impurity of one conductivity type to have low resistance. The first conductive layer 1403 can effectively function as an electrode by utilizing the second conductive layer 1402 as an auxiliary electrode as shown in FIG. 14C. Such a composite electrode structure combining the first conductive layer 1403 and the second conductive layer 1402 allows the capacitor 1304 to be formed in a self-alignment manner.

The capacitor is used as a storage capacitor of a power supply circuit, or a resonant capacitor of a resonant circuit. In particular, the resonant capacitor is required to operate as a capacitor regardless of a positive or negative voltage applied between two terminals of the capacitor, since both positive and negative voltages are applied between the two terminals.

In FIG. 13, the resistor 1305 is constituted by the first conductive layer 1403. The first conductive layer 1403 is formed to have a thickness of about 30 to 150 nm; therefore, the resistor can be formed by appropriately setting the width and length thereof.

The resistor is used as the resistance load of a modulation circuit. It may also be used as the load in the case of controlling current by a VCO or the like. The resistor may be constituted by a semiconductor layer containing a high concentration of impurity element or a thin metal layer. The metal layer is preferably used since the resistance thereof is determined by the film thickness and film quality and has few variations, though the resistance of the semiconductor layer depends on the film thickness, film quality, impurity concentration, activation rate, and the like.

In FIG. 13, the P-channel transistor 1303 has the semiconductor layer 1405 including impurity regions 1412. The impurity regions 1412 form source and drain regions that are in contact with the wire 1404. The gate electrode 1409 has a structure where the first conductive layer 1403 and the second conductive layer 1402 overlap each other. The P-channel transistor 1303 is a transistor with a single drain structure where an LDD region is not provided. When the P-channel transistor 1303 is formed, the impurity region 1412 is added with an impurity imparting P-type conductivity, such as boron. On the other hand, when the impurity region 1412 is added with phosphorus, an N-channel transistor with a single drain structure can be obtained.

One or both of the semiconductor layer 1405 and the gate insulating layer 1408 may be oxidized or nitrided by a high density plasma process excited by microwaves under the conditions where the electron temperature is 2 eV or lower, the ion energy is 5 eV or lower, and the electron density approximately ranges from $10^{11}/cm^3$ to $10^{13}/cm^3$. At this time, the substrate temperature is set in the range of 300 to 450° C. under an oxygen atmosphere ($O_2$, $N_2O$, or the like) or a nitrogen atmosphere ($N_2$, $NH_3$, or the like), thereby reducing the defect level in the interface between the semiconductor layer 1405 and the gate insulating layer 1408. When this process is performed to the gate insulating layer 1408, the gate insulating layer 1408 can be densified. In other words, generation of charged defects can be suppressed, and variations in threshold voltage of the TFT can be suppressed.

When the transistor is driven with a voltage of 3 V or lower, the insulating layer that is oxidized or nitrided by the plasma process can be used as the gate insulating layer 1408. If the driving voltage of the transistor is 3 V or higher, the gate insulating layer 1408 can be formed by combining an insulating layer formed over the surface of the semiconductor layer 1405 by the plasma process and an insulating layer deposited by CVD (plasma CVD or thermal CVD). In addition, the insulating layer may also be used as a derivative layer of the capacitor 1304. In this case, the insulating layer formed by the plasma process is a dense film with a thickness of 1 to 10 nm; therefore, a capacitor with a large charge capacity can be obtained.

As described with reference to FIG. 13 and FIGS. 14A to 14E, the elements with various structures can be formed by combining conductive layers with different thicknesses. A region where only the first conductive layer is formed and a region where the first conductive layer and the second conductive layer are stacked can be formed using a photomask or a reticle provided with a diffraction grating pattern or an assist pattern formed of a semi-transparent film and having a function of decreasing light intensity. That is to say, the amount of light passing through a photomask is controlled when the photoresist is exposed to light in a photolithography step, so that developed resist masks have different thicknesses. In that case, the resist with a complicated shape may be formed by providing the photomask or the reticle with a slit below the resolution limit. Further, the mask pattern made of a photoresist material may be deformed by baking at a temperature of about 200° C. after the development.

In addition, the region where only the first conductive layer is formed and the region where the first conductive layer and the second conductive layer are stacked can be continuously formed using a photomask or a reticle provided with a diffraction grating pattern or an assist pattern formed of a semi-transparent film and having a function of decreasing light intensity. As shown in FIG. 14A, the region where only the first conductive layer is formed can be selectively formed over the semiconductor layer. Such a region is effective over the semiconductor layer, though it is not necessary in other regions (wiring regions connected to the gate electrode). When the photomask or the reticle is used, the region only the first conductive layer is formed is not provided in the wiring regions, which substantially increases the wiring density.

In the case of FIG. 13 and FIGS. 14A to 14E, the first conductive layer is formed to have a thickness of 30 to 50 nm using a high melting point metal such as tungsten (W), chromium (Cr), tantalum (Ta), tantalum nitride (TaN), and molybdenum (Mo), or an alloy or compound including the high melting point metal as its main component. In addition, the second conductive layer is formed to have a thickness of 300 to 600 nm using a high melting point metal such as tungsten (W), chromium (Cr), tantalum (Ta), tantalum nitride (TaN), and molybdenum (Mo), or an alloy or compound including the high melting point metal as its main component. For example, the first conductive layer and the second conductive layer are formed of different conductive materials so as to have a difference in etching rate in the subsequent etching step. The first conductive layer and the second conductive layer may be formed of, for example, TaN and tungsten respectively.

If a gate wire is formed using the second conductive layer, the first conductive layer may be formed so that both sides thereof are aligned. As a result, a fine gate wire can be obtained. In addition, the LDD region overlapping the gate electrode is not required to be formed in a self-alignment manner.

This embodiment shows the case where the transistor, the capacitor, and the resistor each having a different electrode structure can be formed in the same step using a photomask or a reticle provided with a diffraction grating pattern or an assist pattern formed of a semi-transparent film and having a function of decreasing light intensity. According to this embodiment, elements having different structures in accordance with the circuit characteristics can be simultaneously formed and integrated without increasing the number of steps When there are variations in thickness of the LDD region that is formed by combining conductive layers with different thicknesses according to this embodiment, the doping concentration thereof varies. When there are variations in doping concentration, the electrical characteristics of the TFT vary. When there are variations in electrical characteristics of the TFT, the electrical characteristics of a semiconductor device such as a display device and a logic circuit device vary. Since variations in electrical characteristics of a semiconductor device lead to a decrease in productivity, it is necessary to determine that there are few variations in electrical characteristics. This can be determined easily by using the oscillation circuit for evaluation of the invention, which is formed at the same time as the semiconductor device and includes TFTs formed by combining conductive layers with different thicknesses. Thus, element with different structures can be simultaneously formed and integrated without increasing the number of steps.

Embodiment 5

This embodiment shows the case where each of a plurality of oscillation circuits for evaluation is constituted by a semiconductor element with different electrical characteristics.

In a display device, a semiconductor element constituting a pixel and a semiconductor element constituting a driver for controlling the operation of the pixel may have different electrical characteristics because of a difference in the thickness of a gate insulating film, a difference in doping concentration, or a difference in channel length.

Further, a plurality of semiconductor elements constituting the driver have different channel widths (direction perpendicular to the channel length) depending on a required current.

This embodiment shows the case where oscillation circuits for evaluation of the invention are constituted by connecting one measuring terminal to four outputs of two kinds of circuits: two oscillation circuits for evaluation including semiconductor elements constituting a pixel and two oscillation circuits for evaluation including semiconductor elements constituting a driver. The number of each of the oscillation circuits for evaluation including semiconductor elements constituting a pixel and the oscillation circuits for evaluation including semiconductor elements constituting a driver is not limited to two. The number of each of the two kinds of oscillation circuits for evaluation may be two or more in order to evaluate variations, and may be one if only in order to obtain the oscillation frequency. The two kinds of oscillation circuits for evaluation do not necessarily include semiconductor elements constituting a pixel and semiconductor elements constituting a driver, and may have different electrical characteristics.

If there are no variations in electrical characteristics in the structure of this embodiment, when measurement is performed by applying a probe to the measuring terminal and Fourier transform is carried out, it is possible to obtain the oscillation frequency of the oscillation circuits for evaluation including semiconductor elements constituting a pixel and the oscillation frequency of the oscillation circuits for evaluation including semiconductor elements constituting a driver.

If the two oscillation circuits for evaluation including semiconductor elements constituting a pixel have different oscillation frequencies and the two oscillation circuits for evaluation including semiconductor elements constituting a driver have different oscillation frequencies in the structure of this embodiment, when measurement is performed by applying a probe to the measuring terminal and Fourier transform is carried out, four oscillation frequencies can be obtained. On the other hand, if the four oscillation frequencies are obtained in the structure of this embodiment, it is found that there are variations in the semiconductor elements including wires, which constitute each of the oscillation circuits for evaluation.

As described in this embodiment, the invention can be applied even when the semiconductor elements constituting each of the oscillation circuits for evaluation have different electrical characteristics.

This application is based on Japanese Patent Application serial No. 2005-160947 filed in Japan Patent Office on Jun. 1, 2005, the entire contents of which are hereby incorporated by reference.

What is claimed is:

1. An element substrate comprising:
    a semiconductor device including a transistor;
    a measuring terminal;
    at least first and second oscillation circuits for evaluation; and
    a wire connecting the first and second oscillation circuits for evaluation to the measuring terminal,
    wherein each of the first and second oscillation circuits for evaluation includes a transistor; and
    wherein the transistor included in each of the first and second oscillation circuits for evaluation is manufactured in the same step as the transistor included in the semiconductor device.

2. The element substrate according to claim 1, wherein the measuring terminal includes a power supply terminal, a ground terminal, or a control input terminal.

3. The element substrate according to claim 1, wherein the transistor included in the semiconductor device is provided in a pixel portion or a driver circuit portion.

4. The element substrate according to claim 1, wherein a resistor or a capacitor is provided between the measuring terminal and the first and second oscillation circuits for evaluation.

5. The element substrate according to claim 1, wherein the transistor is a thin film transistor.

6. An element substrate comprising:
    a semiconductor device including a transistor;
    a measuring terminal;
    at least a first region and a second region, the first region including at least a first oscillation circuit for evaluation and a second oscillation circuit for evaluation and the second region including at least a first oscillation circuit for evaluation and a second oscillation circuit for evaluation; and
    a wire connecting the first and second oscillation circuits for evaluation in the first region and the first and second oscillation circuits for evaluation in the second region to the measuring terminal,
    wherein each of the first and second oscillation circuits for evaluation in the first region and the second region includes a transistor; and
    wherein the transistor included in each of the first and second oscillation circuits for evaluation in the first region and the second region is manufactured in the same step as the transistor included in the semiconductor device.

7. The element substrate according to claim 6, wherein the measuring terminal includes a power supply terminal, a ground terminal, or a control input terminal.

8. The element substrate according to claim 6, wherein the transistor included in the semiconductor device is provided in a pixel portion or a driver circuit portion.

9. The element substrate according to claim 6, wherein a resistor or a capacitor is provided between the measuring terminal and the first and second oscillation circuits for evaluation.

10. The element substrate according to claim 6, wherein the transistor is a thin film transistor.

11. A test method for an element substrate, comprising:
    forming a transistor in each of a pixel portion and an oscillation circuit portion for evaluation over a substrate in the same step;
    forming in the oscillation circuit portion for evaluation at least first and second oscillation circuits for evaluation including the transistor, and a measuring terminal connected to the first and second oscillation circuits for evaluation; and testing the transistor formed in the pixel portion using the measuring terminal.

12. The test method for an element substrate according to claim 11, wherein a waveform obtained at the measuring terminal has a peak that is considered as a frequency of the first and second oscillation circuits for evaluation.

13. The test method for an element substrate according to claim 11, wherein a waveform obtained at the measuring terminal is Fourier transformed.

14. The element substrate according to claim 11, wherein the transistor is a thin film transistor.

15. A test method for an element substrate, comprising:
forming a transistor in each of a pixel portion, a driver circuit portion, and an oscillation circuit portion for evaluation over a substrate in the same step;
forming in the oscillation circuit portion for evaluation at least first and second oscillation circuits for evaluation including the transistor, and a measuring terminal connected to the first and second oscillation circuits for evaluation; and
testing the transistor formed in the pixel portion and the transistor formed in the driver circuit portion using the measuring terminal.

16. The test method for an element substrate according to claim 15, wherein the first and second oscillation circuits for evaluation are formed in each of the pixel portion and the driver circuit portion.

17. The test method for an element substrate according to claim 15, wherein a waveform obtained at the measuring terminal has a peak that is considered as a frequency of the first and second oscillation circuits for evaluation.

18. The test method for an element substrate according to claim 15, wherein a waveform obtained at the measuring terminal is Fourier transformed.

19. The element substrate according to claim 15, wherein the transistor is a thin film transistor.

20. A manufacturing method for a semiconductor device, comprising:
forming a semiconductor film in a pixel portion, a driver circuit portion, and an oscillation circuit portion for evaluation over a substrate;
forming a gate electrode over the semiconductor film with an insulating film interposed therebetween;
adding an impurity element to the semiconductor film using the gate electrode, whereby forming an impurity region;
forming a wire connected to the impurity region; and
forming a measuring terminal connected to oscillation circuits for evaluation in the oscillation circuit portion for evaluation at the same time as the formation of the wire.

21. The manufacturing method for a semiconductor device according to claim 20, wherein testing is performed by using the measuring terminal.

22. The manufacturing method for a semiconductor device according to claim 20, wherein the substrate is a single crystal silicon substrate, a quartz substrate, a glass substrate, a plastic substrate, or a metal substrate.

23. A manufacturing method for a semiconductor device, comprising:
forming a semiconductor film in a pixel portion, a driver circuit portion, and an oscillation circuit portion for evaluation over a substrate;
forming a gate electrode over the semiconductor film with an insulating film interposed therebetween;
adding an impurity element to the semiconductor film using the gate electrode, whereby forming an impurity region;
forming a wire connected to the impurity region;
forming a measuring terminal connected to oscillation circuits for evaluation in the oscillation circuit portion for evaluation at the same time as the formation of the wire;
testing using the measuring terminal; and
cutting the oscillation circuit portion for evaluation.

24. The manufacturing method for a semiconductor device according to claim 23, wherein the substrate is a single crystal silicon substrate, a quartz substrate, a glass substrate, a plastic substrate, or a metal substrate.

* * * * *